United States Patent
Furuhata

(10) Patent No.: US 11,084,712 B2
(45) Date of Patent: Aug. 10, 2021

(54) PHYSICAL QUANTITY SENSOR WITH SPRING HAVING PROTECTIVE BEAM

(71) Applicant: Seiko Epson Corporation, Tokyo (JP)

(72) Inventor: Makoto Furuhata, Matsumoto (JP)

(73) Assignee: Seiko Epson Corporation

( * ) Notice: Subject to any disclaimer, the term of this patent is extended or adjusted under 35 U.S.C. 154(b) by 254 days.

(21) Appl. No.: 16/200,999

(22) Filed: Nov. 27, 2018

(65) Prior Publication Data
US 2019/0162749 A1 May 30, 2019

(30) Foreign Application Priority Data
Nov. 28, 2017 (JP) .............................. JP2017-228339

(51) Int. Cl.
*B81B 3/00* (2006.01)
*G01P 15/125* (2006.01)
*G01P 15/097* (2006.01)
*G01P 15/08* (2006.01)

(52) U.S. Cl.
CPC .......... *B81B 3/0051* (2013.01); *G01P 15/097* (2013.01); *G01P 15/125* (2013.01); *B81B 2201/0235* (2013.01); *G01P 15/0802* (2013.01); *G01P 2015/0857* (2013.01)

(58) Field of Classification Search
CPC ... B81B 3/0016; B81B 3/0002; B81B 3/0051; G01P 2015/0857; G01P 2015/0862; G01P 2015/0871; G01P 15/0802; G01P 15/125; G01P 15/097
See application file for complete search history.

(56) References Cited

U.S. PATENT DOCUMENTS

| 5,025,346 | A | * | 6/1991 | Tang | B81B 3/0021 |
| | | | | | 361/283.1 |
| 6,065,341 | A | * | 5/2000 | Ishio | B81B 3/0051 |
| | | | | | 361/283.3 |
| 6,105,428 | A | * | 8/2000 | Schmiesing | G01P 15/0802 |
| | | | | | 361/283.3 |
| 6,318,174 | B1 | * | 11/2001 | Schmiesing | G01P 15/0802 |
| | | | | | 73/510 |
| 6,450,033 | B1 | * | 9/2002 | Ito | B81B 3/0051 |
| | | | | | 73/514.29 |
| 7,000,473 | B2 | * | 2/2006 | Vandemeer | G01P 15/08 |
| | | | | | 73/514.32 |

(Continued)

FOREIGN PATENT DOCUMENTS

DE 102016203092 A1 * 5/2017 ............ G01P 15/125
JP 2003-149568 A 5/2003

*Primary Examiner* — David L Singer
(74) *Attorney, Agent, or Firm* — Harness, Dickey & Pierce, P.L.C.

(57) ABSTRACT

A physical quantity sensor includes a movable body and a spring that supports the movable body. The spring includes an arm having an elongate shape in a first direction, and a first beam and a second beam that are adjacent to the arm and are disposed in the first direction. An end portion of the first beam on the second beam side and an end portion of the second beam on the first beam side are disposed side by side in a second direction orthogonal to the first direction. The beams preferably are protective of the side surfaces of the spring arm, function to enable arm machining accuracy, reduce shape deviations, and reduce the occurrence of quadrature. The sensor exemplarily may detect angular rate or acceleration.

17 Claims, 31 Drawing Sheets

(56) References Cited

U.S. PATENT DOCUMENTS

| | | | |
|---|---|---|---|
| 2003/0027370 A1 | 2/2003 | Helin | |
| 2003/0177831 A1* | 9/2003 | Ikezawa | G01P 1/023 |
| | | | 73/514.16 |
| 2005/0229706 A1* | 10/2005 | Vandemeer | G01P 15/125 |
| | | | 73/514.38 |
| 2006/0236763 A1* | 10/2006 | Terada | G01P 15/097 |
| | | | 73/514.34 |
| 2007/0132045 A1* | 6/2007 | Tsubaki | B81B 7/0048 |
| | | | 257/414 |
| 2009/0256297 A1* | 10/2009 | Geisberger | G01P 15/125 |
| | | | 267/160 |
| 2015/0096378 A1* | 4/2015 | Kigure | G01P 1/003 |
| | | | 73/514.32 |
| 2018/0100874 A1* | 4/2018 | Zhang | G01P 15/097 |

* cited by examiner

PHYSICAL QUANTITY SENSOR WITH SPRING HAVING PROTECTIVE BEAM

CROSS-REFERENCE TO RELATED APPLICATION

This nonprovisional application claims the benefit of Japanese Patent Application No. 2017-228339 filed Nov. 28, 2017, the entire disclosure of which is incorporated herein by reference.

BACKGROUND

1. Technical Field

The present invention relates to a physical quantity sensor, a physical quantity sensor device, a complex sensor device, an inertial measurement unit, a vehicle positioning device, a portable electronic device, an electronic device, and a vehicle.

2. Related Art

An actuator disclosed in JP-A-2003-149568 includes a beam and a protective beam. The protective beam is positioned on a side of the beam and is used for protecting the side surface of the beam. In such a configuration, it is described that, if a distance between the beam and the protective beam is sufficiently reduced, the micro-loading effect (effect in which an etching rate becomes slower and verticality of the etching is improved) is caused, and thus it is possible to perform machining on the beam with high accuracy.

However, in JP-A-2003-149568, on both sides of the beam, a plurality of protective beam is disposed in a direction in which the beam extends, and a gap is formed between the protective beams adjacent to each other. Therefore, in a region of the beam, which is arranged side by side with the gap, the above-described micro-loading effect is not caused, and machining accuracy of the beam is deteriorated. Thus, there is a problem in that it is not possible to perform machining on the entirety of the beam with high accuracy, and a probability of an unnecessary vibration (quadrature) occurring is high.

SUMMARY

An advantage of some aspects of the invention is to provide a physical quantity sensor, a physical quantity sensor device, a complex sensor device, an inertial measurement unit, a vehicle positioning device, a portable electronic device, an electronic device, and a vehicle, in which it is possible to reduce an occurrence of the quadrature.

The invention can be implemented as the following configurations.

A physical quantity sensor according to an aspect of the invention includes a movable body and a spring that supports the movable body. The spring includes an arm having an elongate shape in a first direction, and a first beam and a second beam which are adjacent to the arm and are disposed in the first direction. An end portion of the first beam on the second beam side and an end portion of the second beam on the first beam side are disposed side by side in a second direction orthogonal to the first direction.

With this configuration, it is possible to reduce shape deviation of the arm. Therefore, a physical quantity sensor in which it is possible to reduce the occurrence of the quadrature is obtained.

In the physical quantity sensor, it is preferable that the first beam and the second beam are disposed on both sides of the arm in the second direction, respectively.

With this configuration, it is possible to more effectively reduce the shape deviation of the arm.

In the physical quantity sensor, it is preferable that the first beam includes a first portion having an elongate shape in the first direction, a second portion which has an elongate shape in the first direction and is disposed to be shifted from the first portion in the second direction, and a third portion that connects the first portion and the second portion.

With this configuration, the configuration of the first beam is simplified.

In the physical quantity sensor, it is preferable that the end portion of the first beam on the second beam side has a length in the second direction, which gradually decreases toward the second beam, and the end portion of the second beam on the first beam side has a length in the second direction, which gradually decreases toward the first beam.

With this configuration, it is possible to reduce masses of tip portions of the first beam and the second beam. Therefore, mechanical strength of the first beam and the second beam is improved, and breaking occurs less frequently.

In the physical quantity sensor, it is preferable that, in the end portion of the first beam on the second beam side, a surface on a side facing the second beam is inclined from the first direction in plan view from a third direction orthogonal to the first direction and the second direction, and, in the end portion of the second beam on the first beam side, a surface on a side facing the first beam is inclined from the first direction in plan view from the third direction.

With this configuration, it is possible to reduce masses of the tip portions of the first beam and the second beam. Therefore, mechanical strength of the first beam and the second beam is improved, and breaking occurs less frequently.

In the physical quantity sensor, it is preferable that the first beam includes a first base portion and a first protruding portion which protrudes from the first base portion toward the second beam and has a length in the second direction, which is smaller than that of the first base portion, the second beam includes a second base portion and a second protruding portion which protrudes from the second base portion toward the first beam and has a length in the second direction, which is smaller than that of the second base portion, and the first protruding portion and the second protruding portion are disposed side by side in the second direction.

With this configuration, it is possible to reduce masses of the tip portions of the first beam and the second beam. Therefore, mechanical strength of the first beam and the second beam is improved, and breaking occurs less frequently.

In the physical quantity sensor, it is preferable that the first protruding portion is disposed to be biased toward a side of the first base portion, which is opposite to the second protruding portion, and the second protruding portion is disposed to be biased toward a side of the second base portion, which is opposite to the first protruding portion.

With this configuration, it is possible to arrange the first beam and the second beam so as to be closer to each other, and to save a space.

It is preferable that the physical quantity sensor further includes a third beam positioned on an opposite side of the first beam with respect to the second beam, and an end portion of the second beam on the third beam side and an end portion of the third beam on the second beam side are disposed side by side in the second direction.

With this configuration, it is possible to reduce the first to third beams. Therefore, mechanical strength of the first to third beams is improved, and breaking occurs less frequently.

A physical quantity sensor device includes a physical quantity sensor and a circuit element.

With this configuration, a physical quantity sensor device which is capable of exhibiting the effect of the physical quantity sensor and has high reliability is obtained.

A complex sensor device includes a first physical quantity sensor being the physical quantity sensor, and a second physical quantity sensor that detects a physical quantity different from that detected by the first physical quantity sensor.

With this configuration, a complex sensor device which is capable of exhibiting the effect of the physical quantity sensor, and has high reliability is obtained.

In the complex sensor device, it is preferable that the first physical quantity sensor is a sensor capable of detecting an angular rate, and the second physical quantity sensor is a sensor capable of detecting an acceleration.

With this configuration, a complex sensor device having high convenience is obtained.

An inertial measurement unit includes a physical quantity sensor and a control circuit that controls driving of the physical quantity sensor.

With this configuration, an inertial measurement unit which is capable of exhibiting the effect of the physical quantity sensor and has high reliability is obtained.

A vehicle positioning device includes an inertial measurement unit, a receiving unit (receiver), an acquisition unit, a computation unit, and a calculation unit. The receiving unit (receiver) receives a satellite signal on which position information is superimposed, from a positioning satellite. The acquisition unit acquires the position information in the receiving unit (receiver) based on the received satellite signal. The computation unit computes an attitude of a vehicle based on inertial data output from the inertial measurement unit. The calculation unit calculates the position of the vehicle by correcting the position information based on the computed attitude.

With this configuration, a vehicle positioning device which is capable of exhibiting the effect of the inertial measurement unit and has high reliability is obtained.

A portable electronic device includes a physical quantity sensor, a case in which the physical quantity sensor is accommodated, a processing unit (processor) which is accommodated in the case and processes output data from the physical quantity sensor, a display unit which is accommodated in the case, and a translucent cover that closes an opening portion of the case.

With this configuration, a portable electronic device which is capable of exhibiting the effect of the physical quantity sensor and has high reliability is obtained.

It is preferable that the portable electronic device further includes a satellite positioning system, and measures a distance of a user moving or a movement trajectory.

With this configuration, a portable electronic device having high convenience is obtained.

An electronic device includes a physical quantity sensor and a control unit (controller) that performs a control based on a detection signal output from the physical quantity sensor.

With this configuration, an electronic device which is capable of exhibiting the effect of the physical quantity sensor and has high reliability is obtained.

A vehicle includes a physical quantity sensor and a control unit (controller) that performs a control based on a detection signal output from the physical quantity sensor.

With this configuration, a vehicle which is capable of exhibiting the effect of the physical quantity sensor and has high reliability is obtained.

It is Preferable that the vehicle further includes at least one of an engine system, a brake system, and a keyless entry system, and the control unit (controller) controls the system based on the detection signal.

With this configuration, it is possible to control the system with high precision.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a physical quantity sensor, a physical quantity sensor device, a complex sensor device, an inertial measurement unit, a vehicle positioning device, a portable electronic device, an electronic device, and a vehicle will be described in detail based on embodiments illustrated in the accompanying drawings.

First Embodiment

Firstly, a physical quantity sensor according to a first embodiment will be described.

Figure 1:
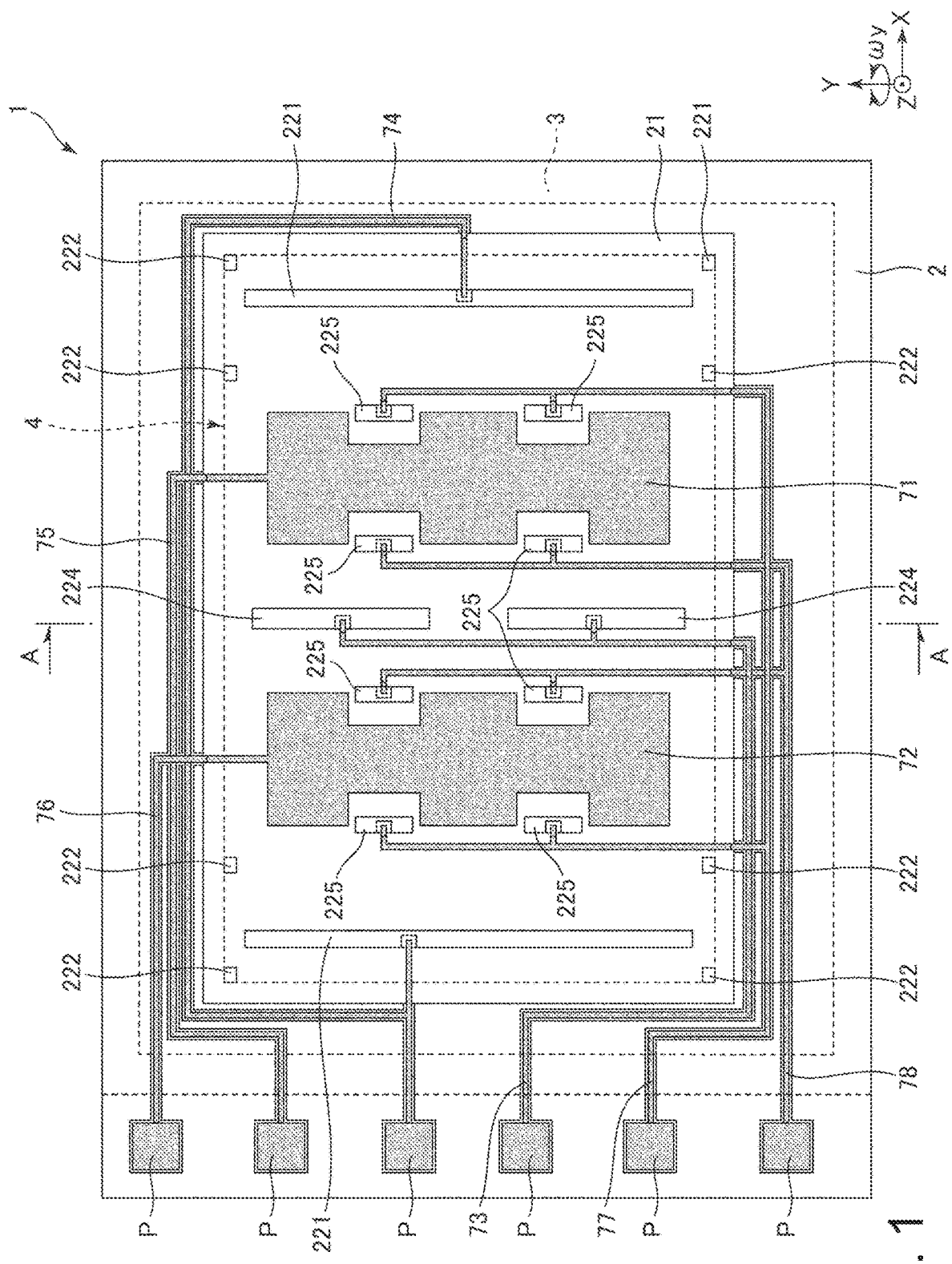
FIG. 1 is a plan view illustrating a physical quantity sensor according to a first embodiment.
Figure 2:
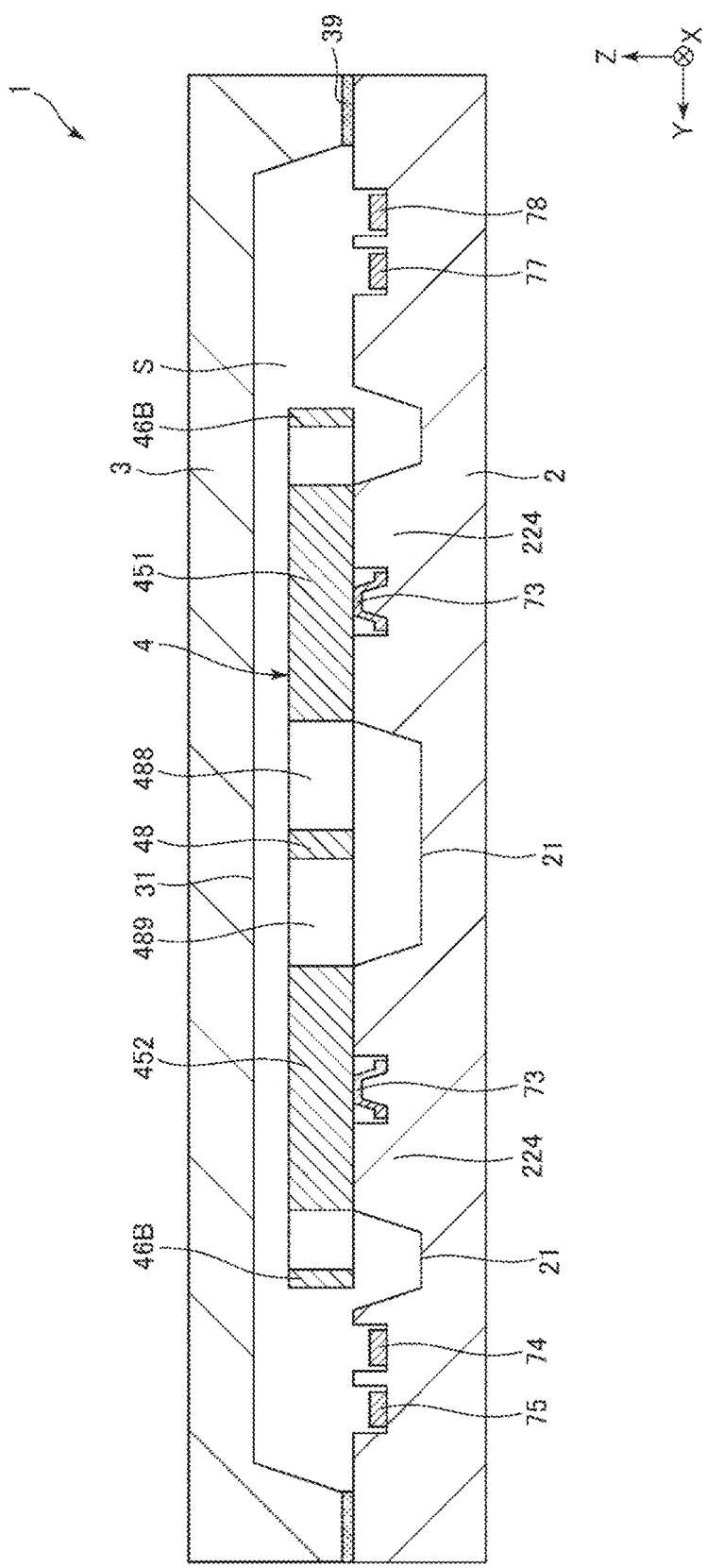
FIG. 2 is a sectional view taken along line A-A in FIG. 1.
Figure 3:
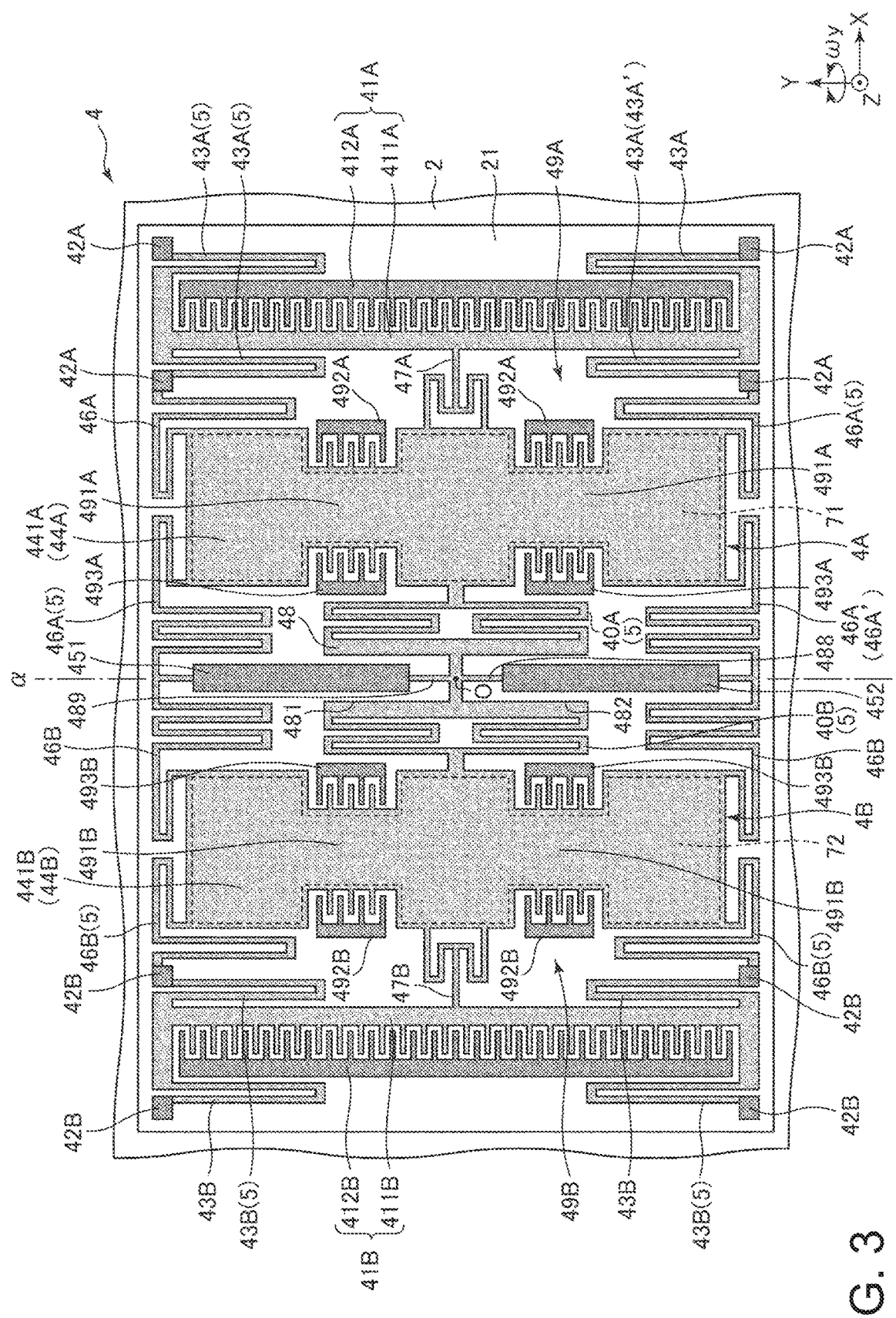
FIG. 3 is a plan view illustrating a sensor element provided in the physical quantity sensor in FIG. 1.
Figure 4:
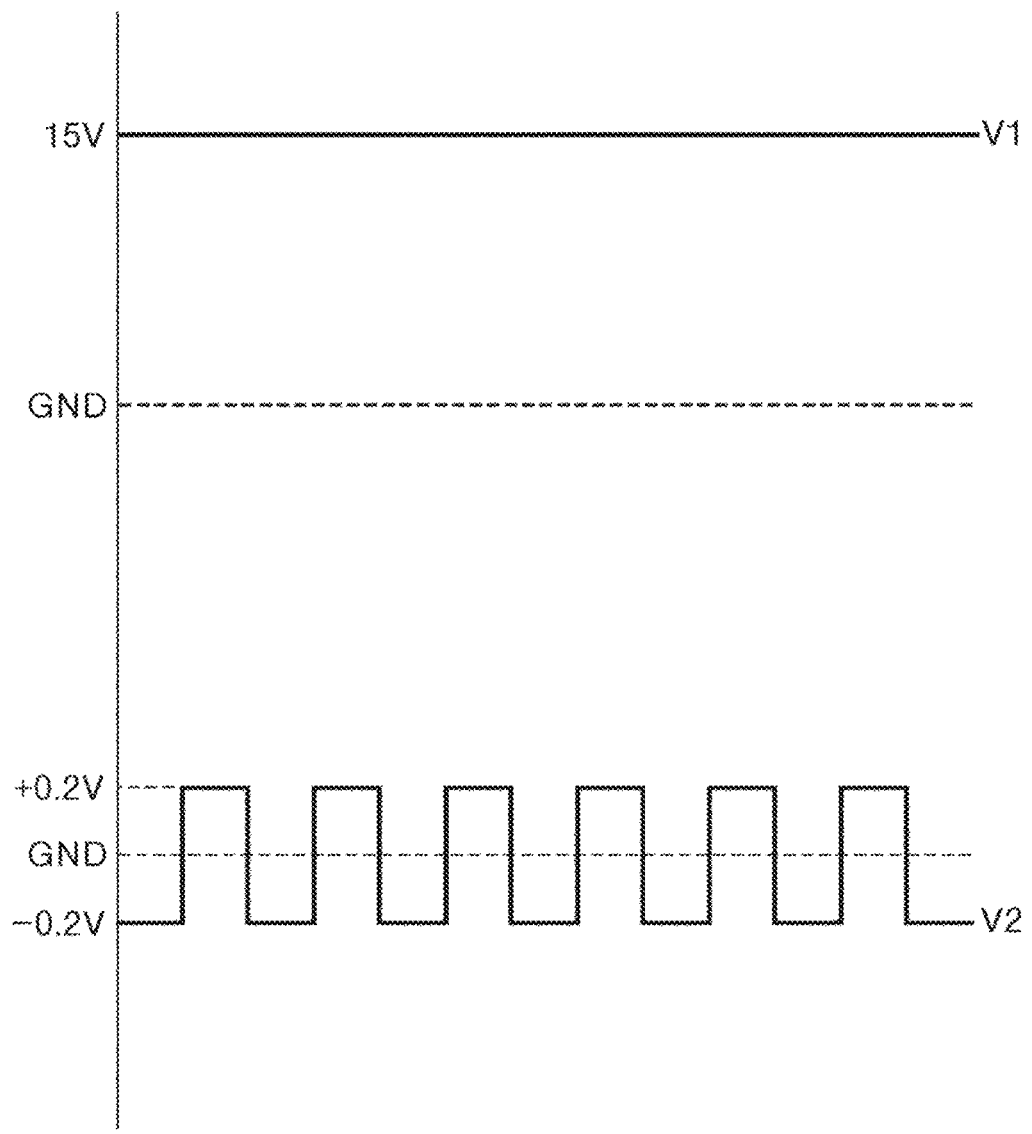
FIG. 4 is a diagram illustrating a voltage applied to the physical quantity sensor in FIG. 1.
Figure 5:
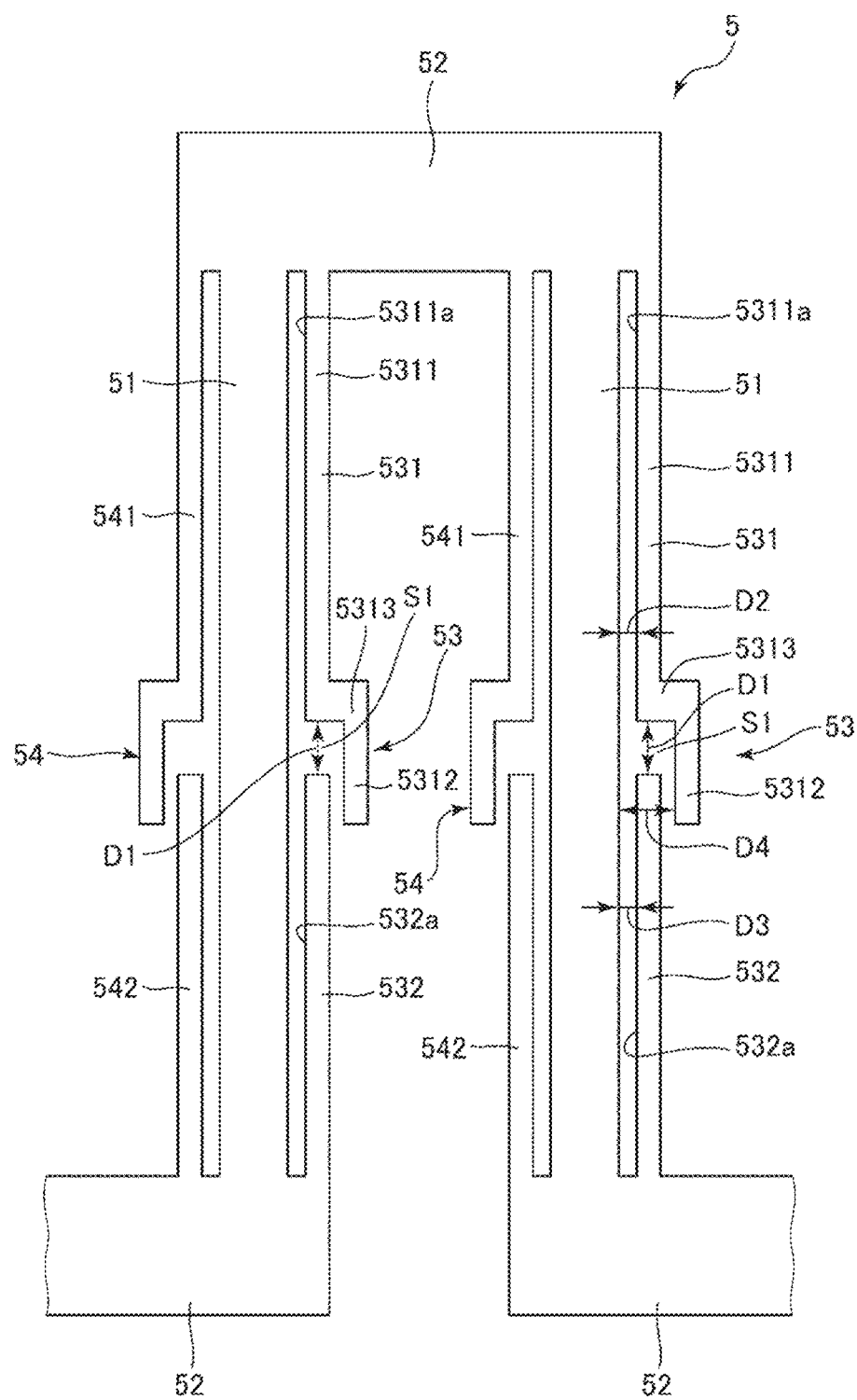
FIG. 5 is a plan view illustrating a spring provided in the sensor element illustrated in FIG. 3.
Figure 6:
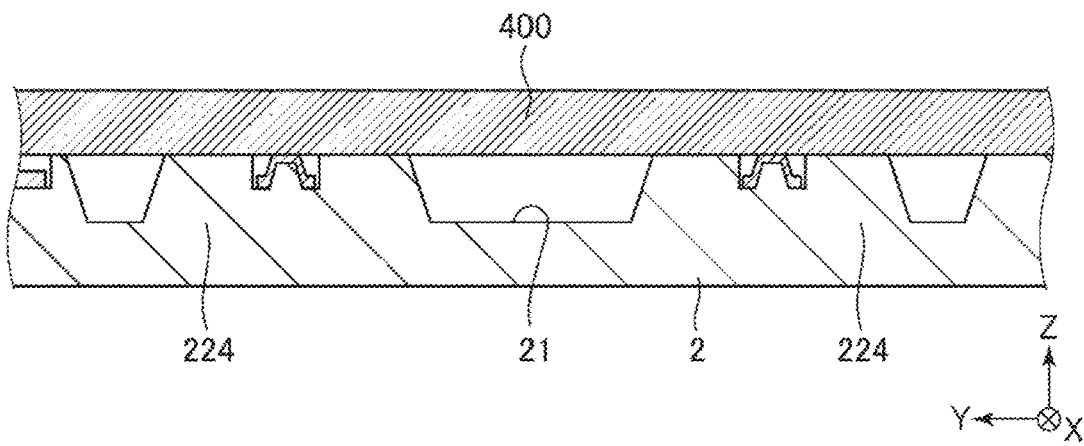
FIG. 6 is a sectional view illustrating a method of forming the sensor element.
Figure 7:
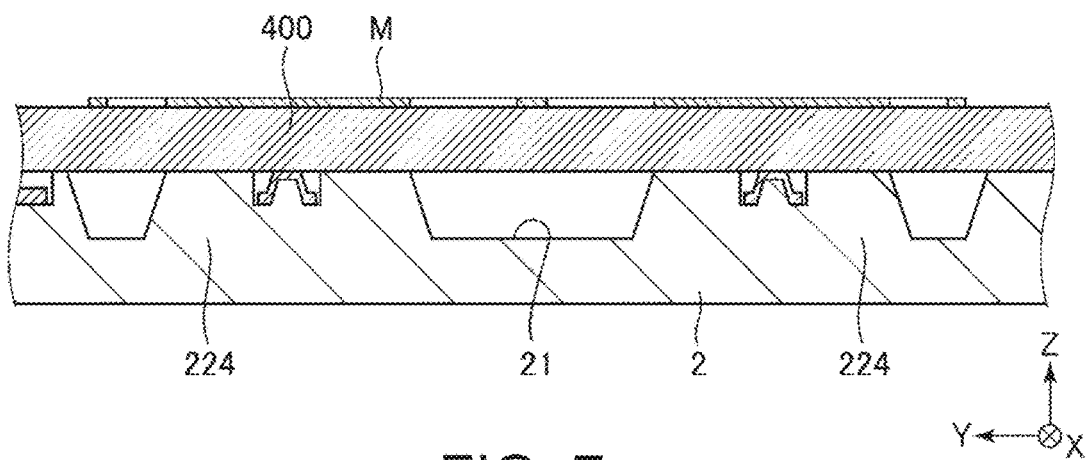
FIG. 7 is a sectional view illustrating the method of forming the sensor element.
Figure 8:
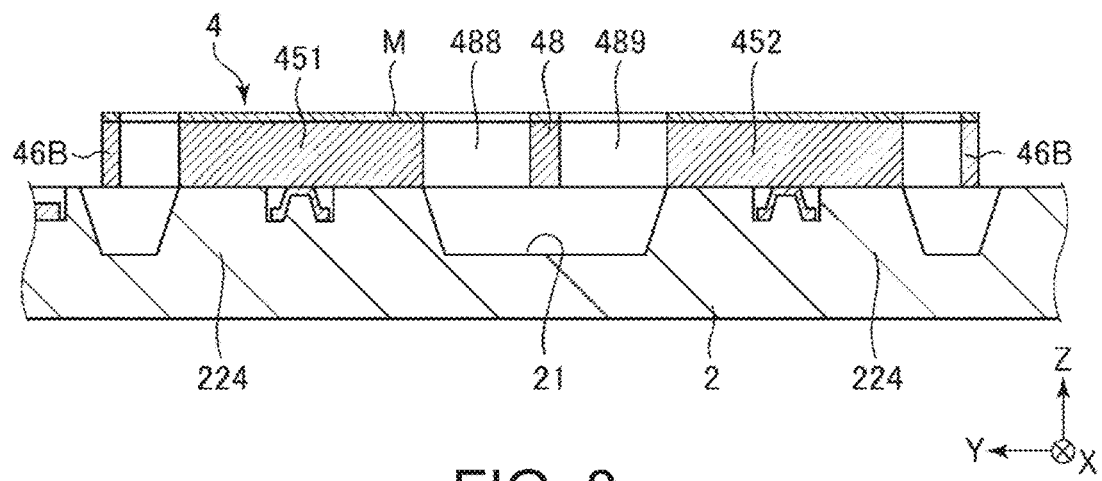
FIG. 8 is a sectional view illustrating the method of forming the sensor element.
Figure 9:
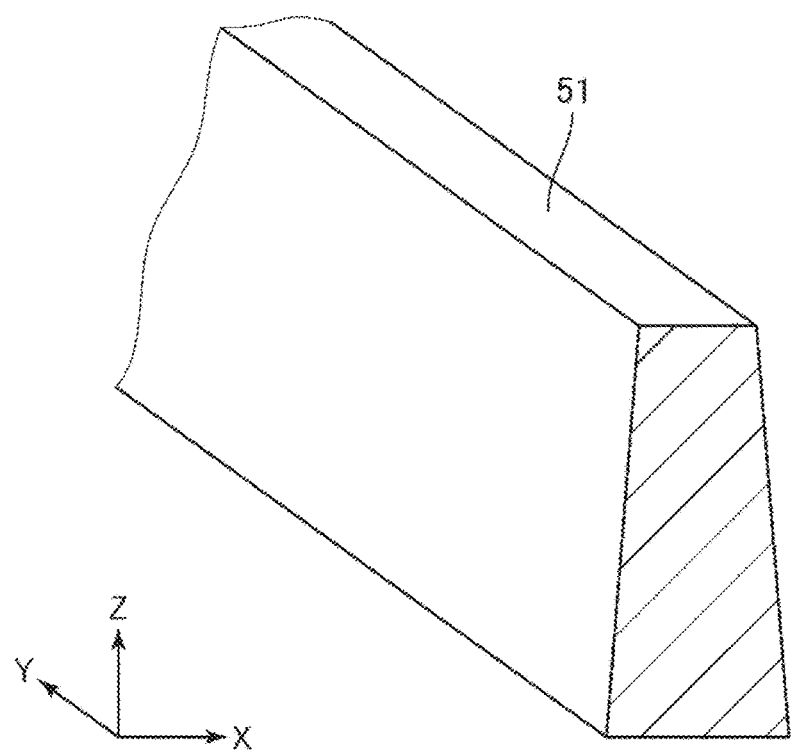
FIG. 9 is a sectional perspective view illustrating a cross-section of an arm.
Figure 10:
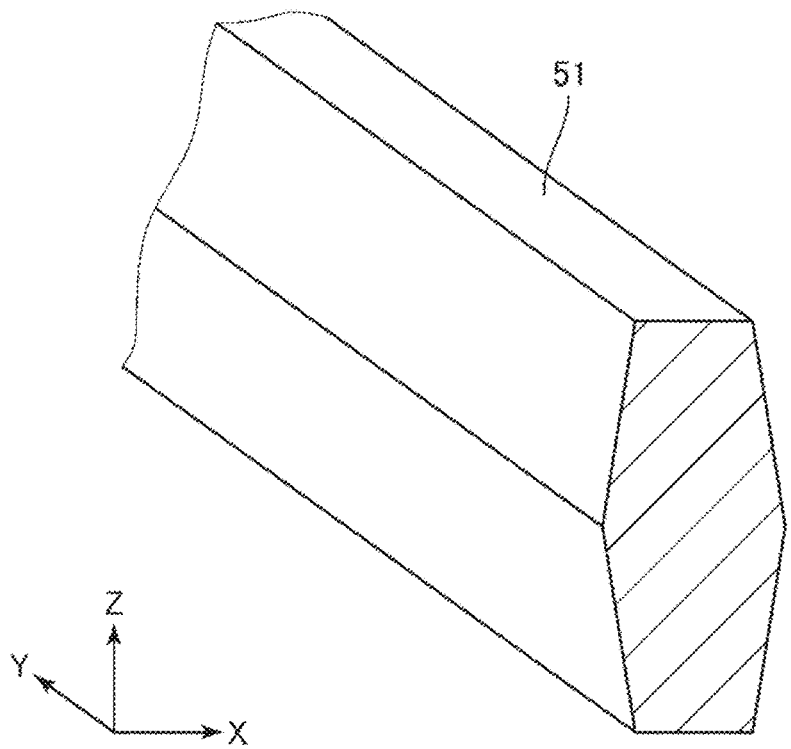
FIG. 10 is a sectional perspective view illustrating the cross-section of the arm.
Figure 11:
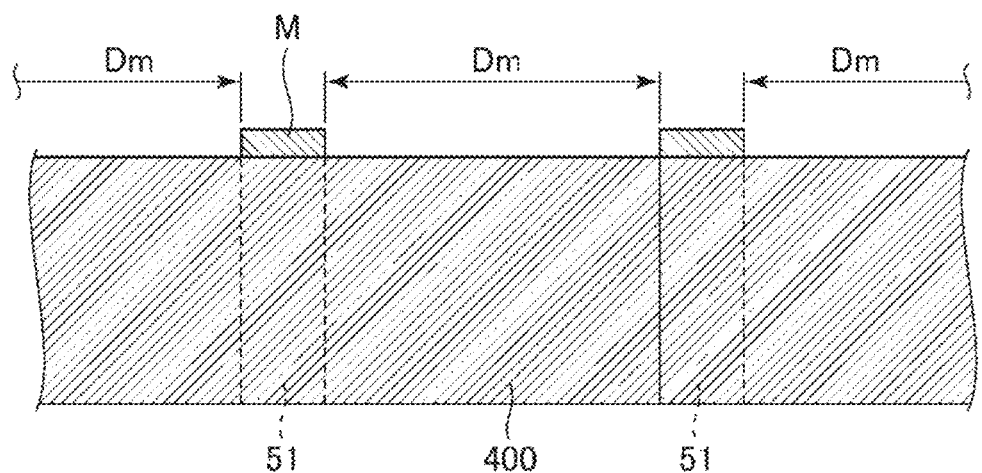
FIG. 11 is a sectional view illustrating a function of a protective beam.
Figure 11:
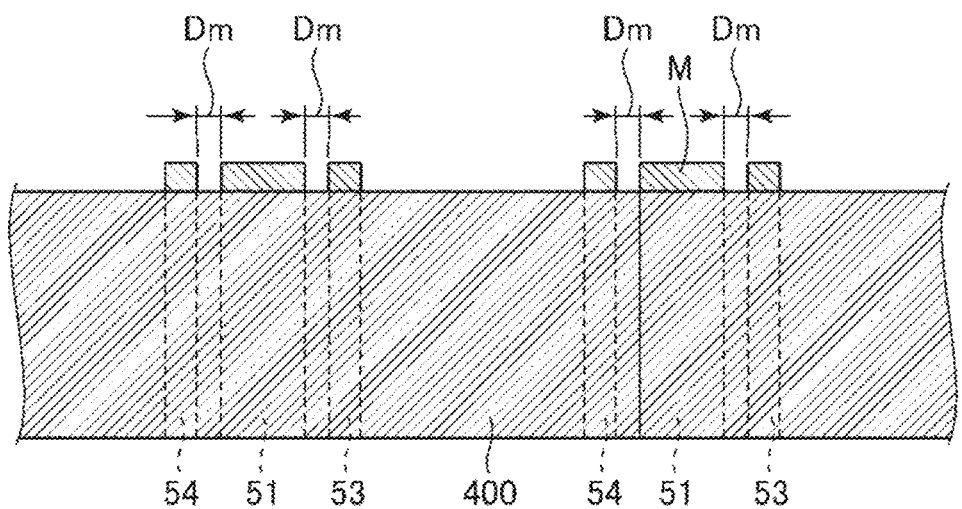
Figure 11:
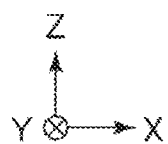
Figure 12:
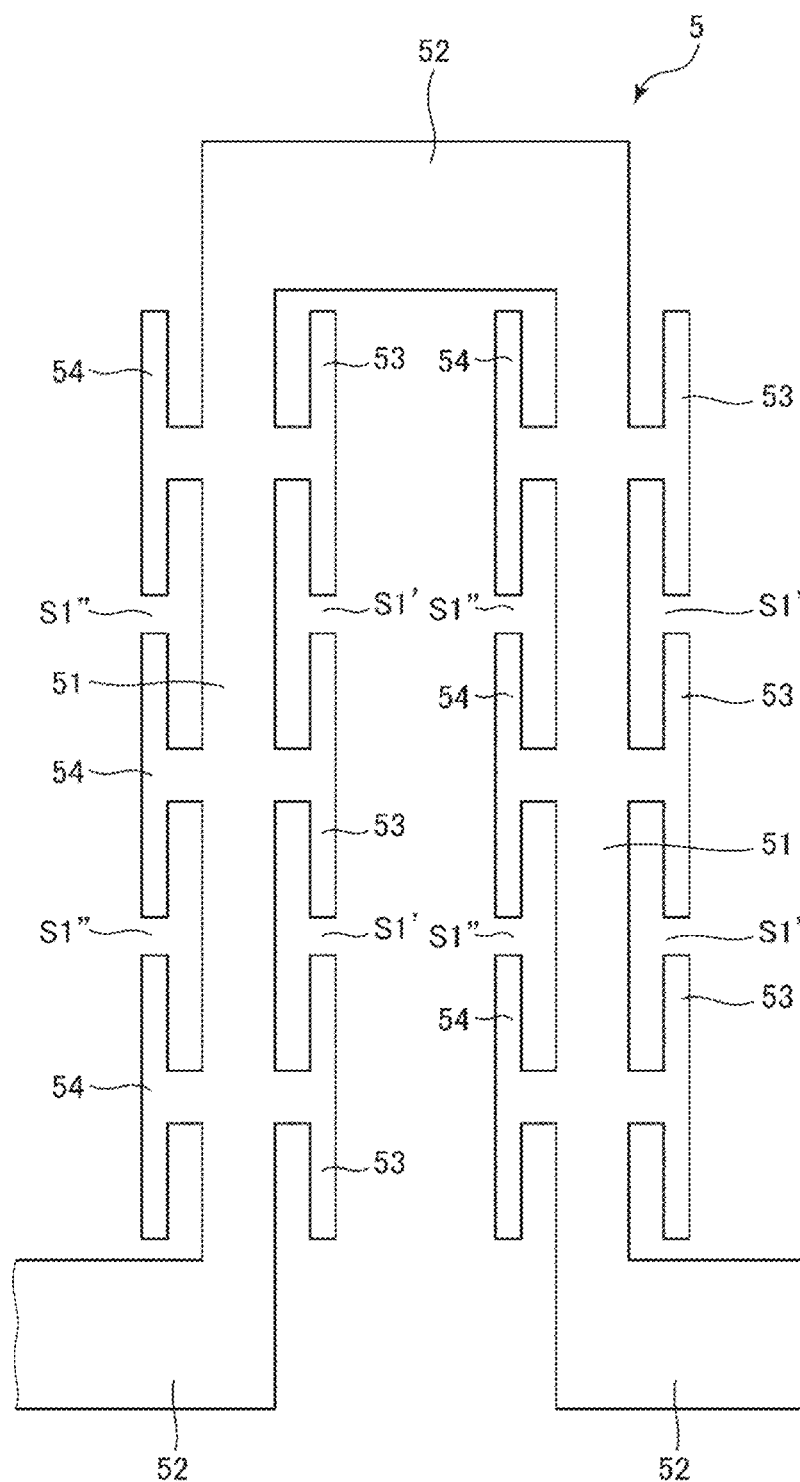
FIG. 12 is a plan view illustrating a spring having a configuration in the related art.
Figure 13:
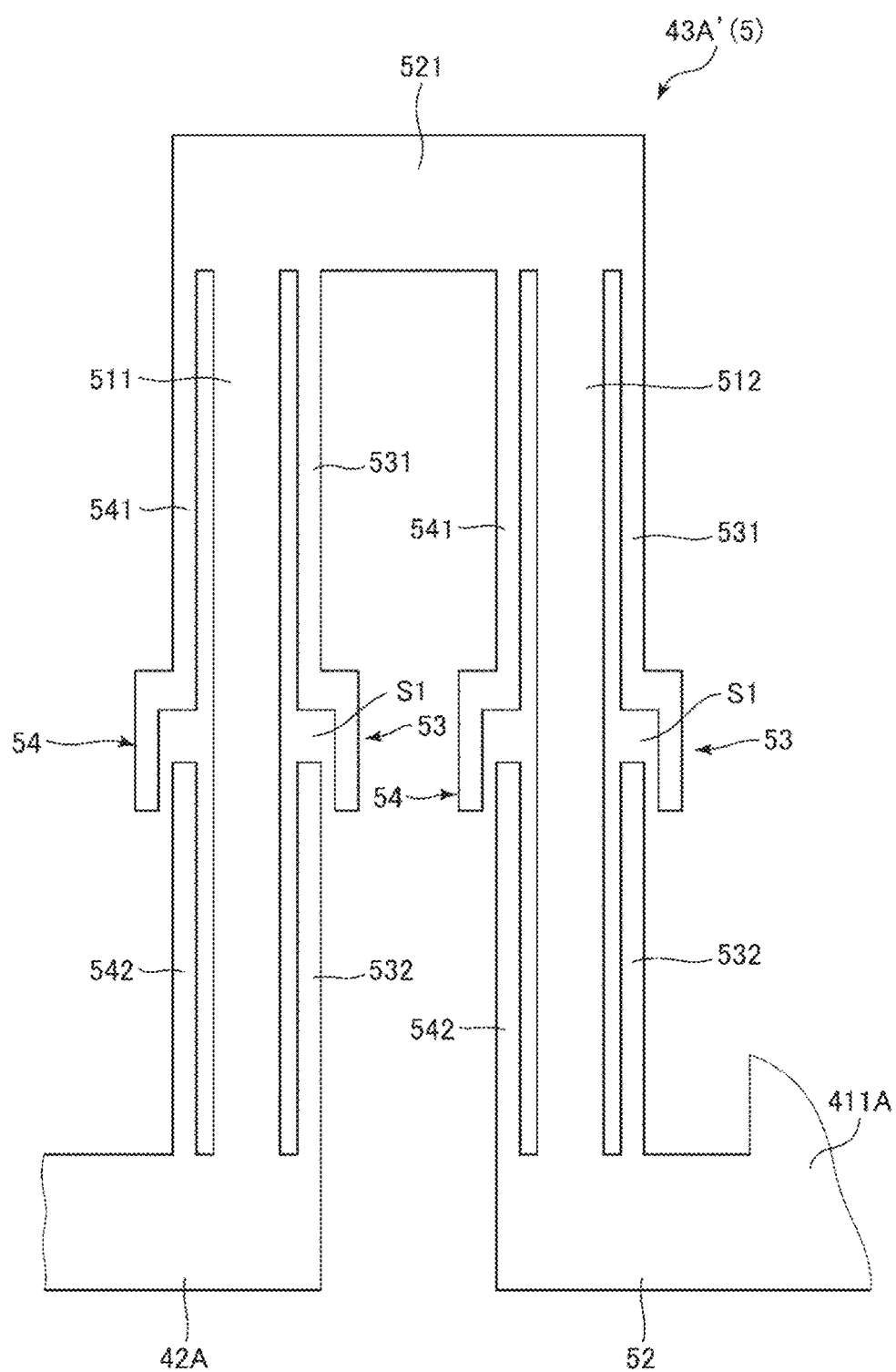
FIG. 13 is a plan view illustrating a driving spring provided in the sensor element.
Figure 14:
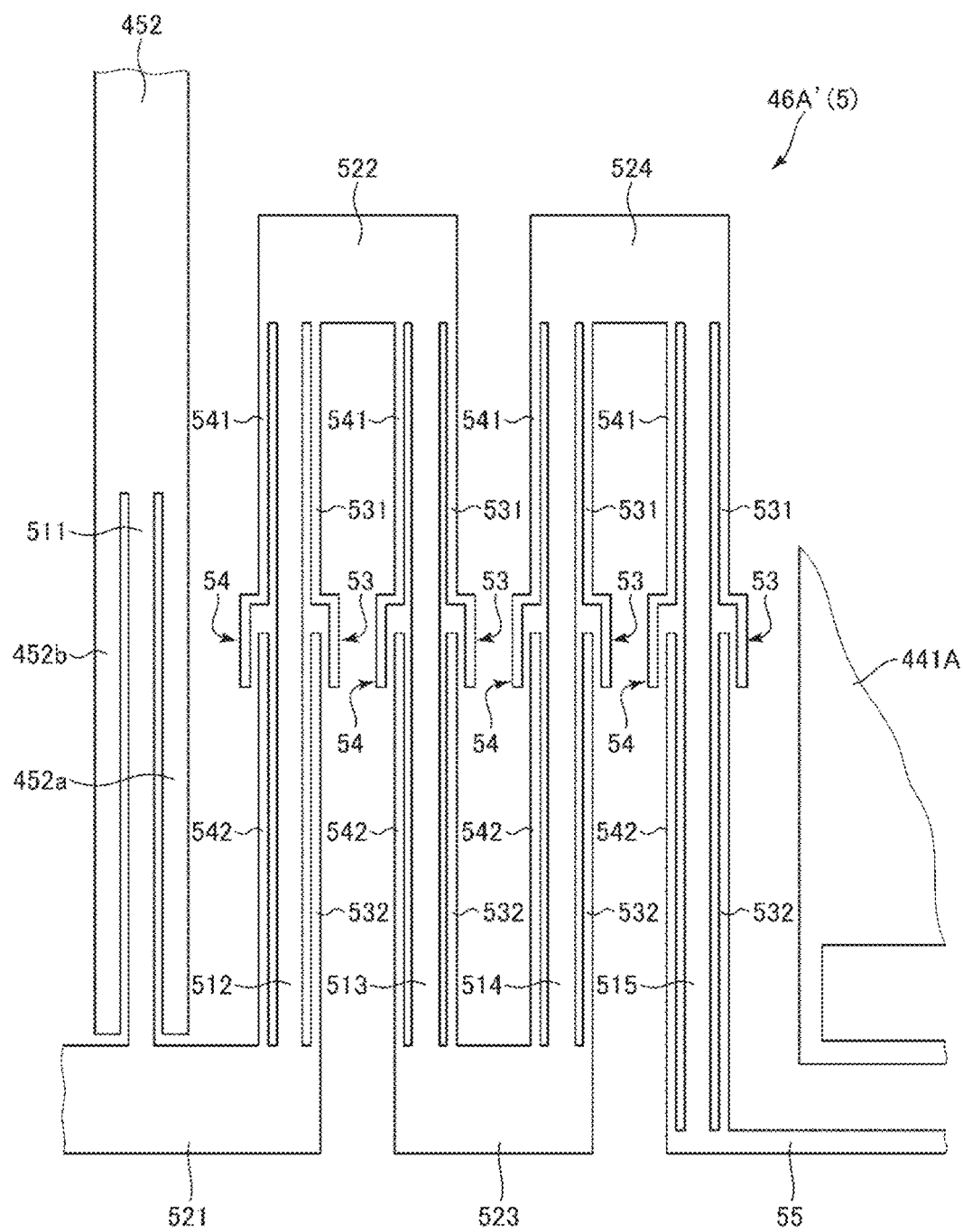
FIG. 14 is a plan view illustrating a detection spring provided in the sensor element.
Figure 15:
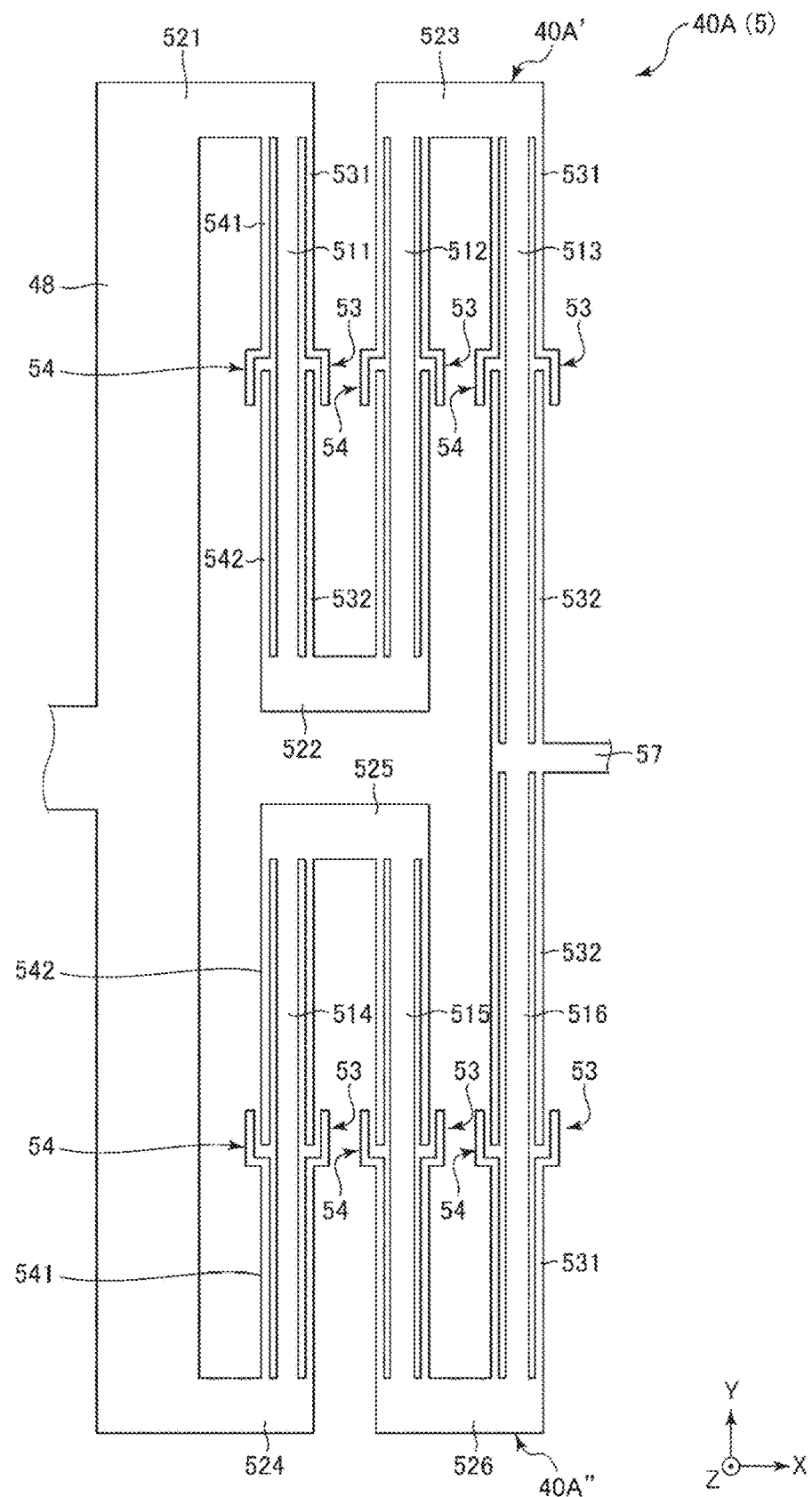
FIG. 15 is a plan view illustrating a connection spring provided in the sensor element.

FIG. 1 is a plan view illustrating the physical quantity sensor according to the first embodiment. FIG. 2 is a sectional view taken along line A-A in FIG. 1. FIG. 3 is a plan view illustrating a sensor element provided in the physical quantity sensor in FIG. 1. FIG. 4 is a diagram illustrating a voltage applied to the physical quantity sensor in FIG. 1. FIG. 5 is a plan view illustrating a spring provided in the sensor element illustrated in FIG. 3. FIGS. 6 to 8 are sectional views illustrating a method of forming the sensor element. FIGS. 9 and 10 are sectional perspective views illustrating the cross-section of the arm. FIG. 11 is a sectional view illustrating a function of a protective beam. FIG. 12 is a plan view illustrating a spring having a configuration in the related art. FIG. 13 is a plan view illustrating a driving spring provided in the sensor element. FIG. 14 is a plan view illustrating a detection spring provided in the sensor element. FIG. 15 is a plan view illustrating a connection spring provided in the sensor element.

An X axis, a Y axis, and a Z axis are illustrated as three axes orthogonal to each other, in the drawings. A direction parallel to the X axis is referred to as "an X-axis direction". A direction parallel to the Y axis is referred to as "a Y-axis direction". A direction parallel to the Z axis is referred to as "a Z-axis direction". A tip side of an arrow indicating each axis is referred to as "a positive side", and an opposite side thereof is referred to as "a negative side". A positive side of the Z-axis direction is referred to as "being up", and a negative side of the Z-axis direction is referred to as "being down".

In this application specification, "being orthogonal" includes a case of crossing at an angle (for example, 90°±5°) which is slightly inclined from 90° in addition to a case of crossing at 90°. Specifically, "being orthogonal" includes a case where the X axis is inclined from a normal direction of a YZ plane by about ±5°, a case where the Y axis is inclined from a normal direction of an XZ plane by about ±5°, and a case where the Z axis is inclined from a normal direction of an XY plane by about ±5°.

A physical quantity sensor 1 illustrated in FIG. 1 is an angular rate sensor capable of detecting an angular rate ωy about the Y axis. The physical quantity sensor 1 includes a substrate 2, a lid 3, and a sensor element 4.

As illustrated in FIG. 1, the substrate 2 has a rectangular shape in plan view. The substrate 2 includes a recess portion 21 opening to the upper surface. The recess portion 21 functions as a clearance portion that prevents a contact of the sensor element 4 and the substrate 2. The substrate 2 includes a plurality of mounts 221, 222, 224, and 225 protruding from the bottom surface of the recess portion 21. The sensor element 4 is bonded to the upper surfaces of the mounts 221, 222, 224, and 225. Thus, it is possible to support the sensor element 4 in a state where a contact with the substrate 2 is prevented.

Fixed detection electrodes 71 and 72 are disposed on the bottom surface of the recess portion 21. The substrate 2 includes groove portions opening to the upper surface, and wirings 73, 74, 75, 76, 77, and 78 are disposed in the groove portions, respectively. One end portion of each of the wirings 73, 74, 75, 76, 77, and 78 is exposed to the outside of the lid 3, and thus functions as an electrode pad P that is electrically connected to an external device.

As such a substrate 2, a glass substrate made of a glass material (specifically, borosilicate glass such as Tempax glass (registered trademark) or Pyrex glass (registered trademark)) containing alkali metal ions (sodium ions) can be used. The material for forming the substrate 2 is not particularly limited, and a silicon substrate, a ceramic substrate, and the like can be used.

As illustrated in FIG. 1, the lid 3 has a rectangular shape in plan view. As illustrated in FIG. 2, the lid 3 includes a recess portion 31 opening to the lower surface. The lid 3 is bonded to the upper surface of the substrate 2 so as to store the sensor element 4 in the recess portion 31. Thus, a storage space S in which the sensor element 4 is stored is formed by the lid 3 and the substrate 2. The storage space S is preferably in a decompressed state, in particular, in a vacuum state. Thus, viscous resistance is reduced, and it is possible to efficiently vibrate the sensor element 4.

As such a lid 3, for example, a silicon substrate can be used. The lid 3 is not particularly limited. For example, a glass substrate or a ceramic substrate may be used. A method of bonding the substrate 2 and the lid 3 to each other is not particularly limited, and may be appropriately selected in accordance with the materials of the substrate 2 and the lid 3. For example, anodic bonding, activated bonding in which bonding surfaces activated by irradiation with plasma are bonded to each other, bonding with a bonding material such as glass frit, and diffusion bonding in which metal films formed on the upper surface of the substrate 2 and the lower surface of the lid 3 are bonded to each other are exemplified. In the embodiment, the substrate 2 and the lid 3 are bonded to each other with glass frit (low-melting glass) 39.

The sensor element 4 is disposed in the storage space S and is bonded to the upper surfaces of the mounts 221, 222, 224, and 225. The sensor element 4 can be formed in a manner that a conductive silicon substrate in which impurities such as phosphorus (P), boron (B), and arsenic (As) have been doped is patterned by using a dry etching method (silicon deep etching. In particular, Bosch method).

A configuration of the sensor element 4 will be described below with reference to FIG. 3. In the following descriptions, in plan view in the Z-axis direction, a straight line which intersects the center O of the sensor element 4 and extends in the Y-axis direction is also referred to as "a virtual straight line α". In FIG. 3, the figure is illustrated too finely. Thus, for easy descriptions, details of the sensor element 4 are not illustrated. Details of the sensor element 4 will be separately described with reference to FIGS. 13 to 15.

As illustrated in FIG. 3, the shape of the sensor element 4 is symmetrical with respect to the virtual straight line α. Such a sensor element 4 includes two driving units 41A and 41B disposed on both sides of the virtual straight line α. The driving unit 41A includes a movable driving electrode 411A having a comb teeth shape and a fixed driving electrode 412A which has a comb teeth shape and is disposed to engage with the movable driving electrode 411A. Similarly, the driving unit 41B includes a movable driving electrode 411B having a comb teeth shape and a fixed driving electrode 412B which has a comb teeth shape and is disposed to engage with the movable driving electrode 411B.

Each of the fixed driving electrodes 412A and 412B is bonded to the upper surface of the mount 221 and is fixed to the substrate 2. Each of the fixed driving electrodes 412A and 412B is electrically connected to the wiring 74.

The sensor element 4 includes four fixation portions 42A arranged around the driving unit 41A and four fixation portions 42B arranged around the driving unit 41B. Each of the fixation portions 42A and 42B is bonded to the upper surface of the mount 222 and is fixed to the substrate 2. The sensor element 4 includes four driving springs 43A and four driving springs 43B. The driving springs 43A join the fixation portions 42A to the movable driving electrode 411A, respectively. The driving springs 43B join the fixation portions 42B to the movable driving electrode 411B, respectively.

The sensor element 4 includes a detection unit 44A and a detection unit 44B. The detection unit 44A is positioned between the driving unit 41A and the virtual straight line α. The detection unit 44B is positioned between the driving unit 41B and the virtual straight line α. The detection unit 44A is configured with a movable detection electrode 441A having a plate shape. Similarly, the detection unit 44B is configured with a movable detection electrode 441B having a plate shape. A fixed detection electrode 71 and a fixed detection electrode 72 are disposed on the bottom surface of the recess portion 21. The fixed detection electrode 71 faces the movable detection electrode 441A and is electrically connected to the wiring 75. The fixed detection electrode 72 faces the movable detection electrode 441B and is electrically connected to the wiring 76. When the physical quantity sensor 1 drives, electrostatic capacitance Ca is formed between the movable detection electrode 441A and the fixed detection electrode 71, and electrostatic capacitance Cb is formed between the movable detection electrode 441B and the fixed detection electrode 72.

The sensor element 4 includes a frame 48 positioned at the center portion (between the detection units 44A and 44B). The frame 48 has an "H" shape and includes a defective portion (recess portion) 481 positioned on the positive side of the Y-axis direction and a defective portion (recess portion) 482 positioned on the negative side of the Y-axis direction. A fixation portion 451 is disposed across the inside and the outside of the defective portion 481. A fixation portion 452 is disposed across the inside and the outside of the defective portion 482. Thus, the fixation portions 451 and 452 can be formed to be long in the Y-axis direction. Accordingly, an area in which the fixation portion is bonded to the substrate 2 increases, and bonding strength between the substrate 2 and the sensor element 4 increases, as much as the lengths of the fixation portions increases. Each of the fixation portions 451 and 452 is electrically connected to the wiring 73.

The sensor element 4 includes four detection springs 46A and four detection springs 46B. The detection springs 46A join the movable detection electrode 441A to the fixation portions 42A, 451, and 452. The detection springs 46B join the movable detection electrode 441B to the fixation portions 42B, 451, and 452. The sensor element 4 includes a beam 47A and a beam 47B. The beam 47A is positioned between the movable driving electrode 411A and the movable detection electrode 441A and connects the movable driving electrode 411A and the movable detection electrode 441A. The beam 47B is positioned between the movable driving electrode 411B and the movable detection electrode 441B and connects the movable driving electrode 411B and the movable detection electrode 441B. In the following descriptions, the assembly of the movable driving electrode 411A, the movable detection electrode 441A, and the beam 47A is also referred to as "a movable body 4A", and the assembly of the movable driving electrode 411B, the movable detection electrode 441B, and the beam 47B are also referred to as "a movable body 4B".

For example, if a voltage V1 illustrated in FIG. 4 is applied to the movable bodies 4A and 4B via the wiring 73, and a voltage V2 illustrated in FIG. 4 is applied to the fixed driving electrodes 412A and 412B via the wiring 74, the movable body 4A and the movable body 4B vibrate in reverse phase in the X-axis direction by electrostatic attraction acting between the movable body 4A and the movable body 4B (driving vibration mode). If the angular rate ωy is applied to the sensor element 4 in a state where the movable body 4A and the movable body 4B vibrate in reverse phase in the X-axis direction, as described above, the movable detection electrodes 441A and 441B vibrate in reverse phase in the Z-axis direction by the Coriolis force, and the electrostatic capacitance Ca and Cb vary with the vibration (detecting vibration mode). Therefore, the angular rate ωy can be obtained based on the change of the electrostatic capacitance Ca and Cb.

In the detecting vibration mode, if the electrostatic capacitance Ca increases, the electrostatic capacitance Cb decreases. On the contrary, if the electrostatic capacitance Ca decreases, the electrostatic capacitance Cb increases. Therefore, if a differential operation (subtraction processing: Ca-Cb) is performed on a detection signal (signal depending on the magnitude of the electrostatic capacitance Ca) obtained from the wiring 75 and a detection signal (signal depending on the magnitude of the electrostatic capacitance Cb) obtained from the wiring 76, it is possible to cancel noise and to detect the angular rate ωy with higher accuracy.

The voltages V1 and V2 are not particularly limited so long as the driving vibration mode is allowed to be excited. In the physical quantity sensor 1 in this embodiment, an electrostatic driving method in which the driving vibration mode is excited by electrostatic attraction is performed. However, a method of exciting the driving vibration mode is not particularly limited. For example, a piezoelectric driving method, or an electromagnetic driving method using a Lorentz force of a magnetic field can also be applied.

As illustrated in FIG. 3, the sensor element 4 includes the frame 48 positioned at the center portion (between the detection units 44A and 44B) thereof. The sensor element 4 includes a frame spring 488 and a frame spring 489. The frame spring 488 is positioned between the fixation portion 451 and the frame 48 and connects the fixation portion 451 and the frame 48. The frame spring 489 is positioned between the fixation portion 452 and the frame 48 and connects the fixation portion 452 and the frame 48.

The sensor element 4 includes a connection spring 40A connecting the frame 48 and the movable detection electrode 441A and a connection spring 40B connecting the frame 48 and the movable detection electrode 441B. The connection spring 40A supports the movable detection electrode 441A along with the detection spring 46A. The connection spring 40B supports the movable detection electrode 441B along with the detection spring 46B. Thus, it is possible to support the movable detection electrodes 441A and 441B with more stable attitude, and to reduce unnecessary vibrations of the movable detection electrodes 441A and 441B.

The sensor element 4 includes monitoring units 49A and 49B that detect vibration states of the movable bodies 4A and 4B in the driving vibration mode. The monitoring unit 49A includes a movable monitoring electrode 491A and fixed monitoring electrodes 492A and 493A. The movable monitoring electrode 491A is disposed in the movable detection electrode 441A and has a comb teeth shape. Each of the fixed monitoring electrodes 492A and 493A has a comb teeth shape and is disposed to engage with the movable monitoring electrode 491A. Similarly, the monitoring unit 49B includes a movable monitoring electrode 491B and fixed monitoring electrodes 492B and 493B. The movable monitoring electrode 491B is disposed in the movable detection electrode 441B and has a comb teeth shape. Each of the fixed monitoring electrodes 492B and 493B has a comb teeth shape and is disposed to engage with the movable monitoring electrode 491B. Each of the fixed monitoring electrodes 492A, 493A, 492B, and 493B is bonded to the upper surface of the mount 225 and is fixed to the substrate 2.

The fixed monitoring electrodes 492A and 492B are electrically connected to a wiring 77. The fixed monitoring electrodes 493A and 493B are electrically connected to a wiring 78. When the physical quantity sensor 1 drives, electrostatic capacitance Cc is formed between the movable monitoring electrode 491A and the fixed monitoring electrode 492A and between the movable monitoring electrode 491B and the fixed monitoring electrode 492B, and electrostatic capacitance Cd is formed between the movable monitoring electrode 491A and the fixed monitoring electrode 493A and between the movable monitoring electrode 491B and the fixed monitoring electrode 493B. In the driving vibration mode, the movable bodies 4A and 4B vibrate in the X-axis direction. Thus, electrostatic capacitance Cc and Cd vary with the vibration. Therefore, it is possible to detect vibration states of the movable bodies 4A and 4B based on the change of the electrostatic capacitance Cc and Cd.

The vibration states (amplitudes) of the movable bodies 4A and 4B, which have been detected by outputs from the monitoring units 49A and 49B are fed back to a driving circuit of applying the voltage V2 to the movable bodies 4A and 4B. The driving circuit changes the frequency or the duty ratio of the voltage V2 such that the amplitudes of the movable bodies 4A and 4B reach aimed values. Thus, it is possible to efficiently vibrate the movable bodies 4A and 4B, and detection accuracy of the angular rate ωy is improved.

The configuration of the sensor element 4 is briefly described above. Next, configurations of the driving springs 43A and 43B, the detection springs 46A and 46B, and the connection springs 40A and 40B as one of features of the physical quantity sensor 1 will be described in detail. The driving springs 43A and 43B, the detection springs 46A and 46B, and the connection springs 40A and 40B have different shapes, but have a common configuration in that each of the springs includes protective beams 53 and 54. In the following descriptions, descriptions will be made on the assumption that the above springs are collectively referred to as "a spring 5", in order to describe the protective beams 53 and 54. In other words, the protective beams 53 and 54 provided in the spring 5 are applied to the driving springs 43A and 43B, the detection springs 46A and 46B, and the connection springs 40A and 40B.

As illustrated in FIG. 5, the spring 5 has a meandering portion reciprocating in the Y-axis direction. Specifically, the spring 5 includes a plurality of arms 51 which extends in the Y-axis direction and is arranged side by side in the X-axis direction, and a plurality of connection portions 52 which is connected to the end portions of the arms 51 and connects the plurality of arms 51 in a meandering manner. The spring 5 having such a configuration extends and contracts in the X-axis direction by each of the plurality of arms 51 elastically deforming in the X-axis direction. The number of arms 51 is not particularly limited. In FIG. 5, for easy descriptions, two arms 51 are illustrated.

The spring 5 includes the protective beam 53 and the protective beam 54. The protective beam 53 is disposed to be adjacent to one side (positive side of the X-axis direction) of each of the arms 51. The protective beam 54 is disposed to be adjacent to the other side (negative side of the X-axis direction) of each of the arms 51. The protective beam 53 includes a first beam 531 and a second beam 532 which are disposed in the Y-axis direction. Similarly, the protective beam 54 includes a first beam 541 and a second beam 542 which are disposed in the Y-axis direction. As described above, since each of the protective beams 53 and 54 is divided into a plurality of beams, it is possible to shorten each of the beams 531, 532, 541, and 542. In addition, mechanical strength of the protective beams 53 and 54 is improved as much as the beams become short, and breaking of the protective beams 53 and 54 occurs less frequently.

The protective beams 53 and 54 have configurations similar to each other (configuration of line symmetry via the arm 51). Thus, in the following descriptions, the protective beam 53 as the representative will be described. Descriptions of the protective beam 54 will be omitted. An end of the first beam 531 on the negative side of the Y-axis direction (end on the second beam 532 side) is referred to as "a tip". An end thereof on the positive side of the Y-axis direction is referred to as "a proximal end". An end of the second beam 532 on the positive side of the Y-axis direction (end on the first beam 531 side) is referred to as "a tip". An end thereof on the negative side of the Y-axis direction is referred to as "a proximal end". The protective beams 53 and 54 may not have a configuration of line symmetry via the arm 51.

The second beam 532 has an elongate shape in the Y-axis direction. The proximal end portion of the second beam 532 is a fixed end by being connected to the connection portion 52, and the tip portion of the second beam is a free end. The width (length in the X-axis direction) of the second beam 532 is constant (including unavoidable errors in manufacturing) in a longitudinal direction. The width of the second beam 532 is not particularly limited, and, is preferably set to be from 1 µm to 3 µm, for example. Thus, it is possible to cause the second beam 532 to become thinner while sufficiently securing mechanical strength of the second beam 532.

The first beam 531 has a crank-like shape including two bent portions in the middle thereof. Specifically, the first beam 531 includes a first portion 5311, a second portion 5312, and a third portion 5313. The first portion 5311 has an elongate shape in the Y-axis direction. The second portion 5312 has an elongate shape in the Y-axis direction and is disposed to be shifted from the first portion 5311 in the X-axis direction. The third portion 5313 connects the tip portion of the first portion 5311 and the proximal end portion of the second portion 5312. The proximal end portion of the first beam 531 is a fixed end by being connected to the connection portion 52, and the tip portion of the first beam is a free end.

As described above, each of the first and second beams 531 and 532 is connected to the connection portion 52. The connection portion 52 is a portion having difficulty in influencing characteristics of the spring 5, in comparison to the arm 51. Therefore, since the connection portion 52 connects the first and second beams 531 and 532, it is possible to reduce fluctuation in characteristics of the spring 5. The design of the entirety of the spring 5 including the first and second beams 531 and 532 is easily performed in comparison to, for example, a case where the first and second beams 531 and 532 are connected to the arm 51.

The width (length in the X-axis direction) of each of the first portion 5311 and the second portion 5312 is constant (including unavoidable errors in manufacturing) in the longitudinal direction. In particular, in this embodiment, the widths of the first and second portions 5311 and 5312 are equal to each other, and this is similarly applied to the width of the second beam 532. The widths of the first and second portions 5311 and 5312 are not particularly limited, and is preferably set to be from 1 µm to 3 µm, for example. Thus, it is possible to cause the first and second portions 5311 and 5312 to become thinner while sufficiently securing mechanical strength of the first and second portions 5311 and 5312. The widths of the first and second portions 5311 and 5312 may be different from each other, this may be similarly applied to the width of the second beam 532.

The first portion 5311 is coaxially disposed side by side with the second beam 532 in the Y-axis direction (the position of the first portion is equal to the position of the second beam in the X-axis direction). Tips of the first portion and the second beam face each other, and a gap S1 is formed between the tips thereof. A distance D1 (width of the gap S1) between the tip of the first portion 5311 and the tip of the second beam 532 is not particularly limited, and is preferably from 1 µm to 5 µm, for example. Thus, it is possible to reduce a contact between the first beam 531 and the second beam 532 and to sufficiently reduce the gap S1.

A side surface 5311a of the first portion 5311 on the arm 51 side is flush with a side surface 532a of the second beam 532 on the arm 51 side (positioned in the same plane). The second portion 5312 is positioned on an opposite side of the arm 51 with respect to the second beam 532. Tip portions of the second portion 5312 and the second beam 532 are arranged side by side in the X-axis direction in a non-contact state. That is, the tip of the first beam 531 is positioned closer to the proximal end side (negative side of the Y-axis direction) of the second beam 532 than the tip side of the second beam 532. The tip of the second beam 532 is positioned closer to the proximal end side (positive side of the Y-axis direction) of the first beam 531 than the tip side of the first beam 531. Therefore, the second portion 5312 can be disposed to face the arm 51 with the gap S1 interposed between the second portion 5312 and the arm 51.

Next, effects obtained by providing such a protective beam 53 will be described. The sensor element 4 can be formed in a manner as follows. As illustrated in FIG. 6, a silicon substrate 400 is bonded to the upper surface of the substrate 2. Then, as illustrated in FIG. 7, a mask M corresponding to the shape of the sensor element 4 is formed on the upper surface of the silicon substrate 400. Then, as illustrated in FIG. 8, the silicon substrate 400 is patterned through the mask M by dry etching. A dry etching method is not particularly limited. For example, a dry Bosch method obtained by combining an etching process using a reactive plasma gas and a deposition process can be used.

Here, in the dry etching step, as an opening of the mask M becomes larger, the mask M is attacked easier by the reactive gas, and verticality of the etching is deteriorated. That is, the side surface of an opening formed by dry etching is easily inclined from the normal line (Z axis) of the silicon substrate 400. Therefore, regardless of forming the arm 51 having a cross-sectional shape which is originally rectangular, for example, the arm 51 having a trapezoidal cross-sectional shape is formed, as illustrated in FIG. 9, or the arm 51 having a barrel-like cross-sectional shape is formed, as illustrated in FIG. 10. As described above, if the cross-sectional shape of the arm 51 collapses from the rectangle, the driving springs 43A and 43B, the detection springs 46A and 46B, and the connection springs 40A and 40B include a vibration component in the Z-axis direction. Thus, in the driving vibration mode, the movable bodies 4A and 4B also vibrate in the Z-axis direction. If the movable bodies 4A and 4B also vibrate in the Z-axis direction, regardless of not applying the angular rate ωy to the physical quantity sensor 1, electrostatic capacitance Ca and Cb vary. Thus, a noise signal is generated by the variation thereof, and detection accuracy of the angular rate ωy is deteriorated. In the following descriptions, vibrations (in particular, vibration in the Z-axis direction) of the movable bodies 4A and 4B in the driving vibration mode in directions other than the X-axis direction are referred to as quadrature.

The protective beam 53 has a function of improving machining accuracy of such an arm 51 and reducing shape deviation from a rectangle (desired shape). The protective beam 53 is disposed to be adjacent to the arm 51. Therefore, as illustrated in FIG. 11, it is possible to reduce a mask opening width Dm of both sides of the arm 51, in comparison to a case where the protective beam 53 is not provided. As the mask opening width Dm is reduced, the micro-loading effect (effect in which an etching rate becomes slower and verticality of the etching is improved) is caused easier. Thus, it is possible to improve verticality of the side surface of the opening, that is, the side surface of the arm 51. Therefore, machining accuracy of the arm 51 is improved, and it is possible to effectively reduce shape deviation of the arm 51 from the desired shape. As a result, the arm 51 including a vibration component in the Z-axis direction has difficulty, and it is possible to effectively reduce the occurrence of quadrature.

Even in the configuration in the related art, as illustrated in FIG. 12, a plurality of protective beams 53 is provided on one side of the arm 51, and a plurality of protective beams 54 is provided on the other side of the arm 51. Thus, the micro-loading effect is caused, and the shape deviation of the arm 51 is reduced. However, a gap S1' is formed between the plurality of protective beams 53, and thus the mask opening width Dm increases at the gap S1'. Similarly, a gap S1" is formed between the plurality of protective beams 54, and the mask opening width Dm increases at the gap S1". Therefore, the micro-loading effect is not caused at the gaps S1' and S1", and thus the shape deviation of the arm 51 occurs at portions corresponding to the gaps S1' and S1". Accordingly, in the configuration in the related art, the vibration component in the Z-axis direction is provided in the entirety of the arm 51, and it is not possible to reduce the occurrence of the quadrature.

On the contrary, in this embodiment, as described above, the second portion 5312 of the first beam 531 is disposed to interpose the gap S1 between the second portion and the arm 51 (see FIG. 5). Thus, it is possible to sufficiently reduce the mask opening width Dm at this portion. Therefore, it is possible to cause the micro-loading effect even in the gap S1, and to effectively reduce the shape deviation of the arm 51 even at a portion corresponding to the gap S1. Therefore, it is possible to perform machining on the entirety of the arm 51 with high accuracy (verticality of etching), and to effectively reduce the occurrence of the quadrature.

Here, each of a distance D2 between the arm 51 and the first portion 5311 of the first beam 531 and a distance D3 between the arm 51 and the second beam 532 is not particularly limited so long as the micro-loading effect can be caused. It is preferable that the distances D2 and D3 become shorter. Specifically, for example, the distances D2 and D3 are preferably equal to or smaller than 5 µm, and more preferably equal to or smaller than 3 µm. Thus, since the distances D2 and D3 are sufficiently short, it is possible to cause the micro-loading effect with higher reliability, and to effectively reduce the shape deviation of the arm 51.

From a viewpoint of easily causing the micro-loading effect, as described above, it is preferable that the distances D2 and D3 become shorter. However, if the distances D2 and D3 are too short, the arm 51 may come into contact with the first or second beam 531 or 532. Therefore, from a viewpoint of reducing a contact of the arm 51 with the first or second beam 531 or 532, each of the distances D2 and D3 is preferably equal to or larger than 1 µm.

A distance D4 between the arm 51 and the second portion 5312 of the first beam 531 is not particularly limited so long as the micro-loading effect can be caused. It is preferable that the distance D4 becomes shorter. Specifically, the distance D4 is preferably equal to or smaller than, for example, 5 µm, and more preferably equal to or smaller than 3 µm. Thus, since the distance D4 is sufficiently short, it is possible to cause the micro-loading effect with higher reliability, and to effectively reduce the shape deviation of the arm 51.

The spring 5 is described above. In the above-described spring 5, the protective beams 53 and 54 are provided for all arms 51. However, the invention is not limited thereto. For example, the protective beams 53 and 54 may not be provided for at least one of the plurality of arms 51. In the above-described spring 5, the protective beams 53 and 54 are provided on both sides of the arm 51. However, the invention is not limited thereto. For example, any one of the protective beams 53 and 54 may be omitted. Even if any one of the protective beams 53 and 54 is omitted, regarding the side surface of at least one side of the arm 51, high verticality is obtained. Thus, it is possible to exhibit the above-described effect.

Next, the driving springs 43A and 43B, the detection springs 46A and 46B, and the connection springs 40A and 40B in this embodiment, to which such a spring 5 has been applied will be described.

Firstly, a driving spring 43A' in FIG. 3 will be described as the representative of the plurality of driving springs 43A and 43B. As illustrated in FIG. 13, the driving spring 43A' includes two arms 511 and 512, a connection portion 521, and a connection portion 522. The arms 511 and 512 extend in the Y-axis direction and are arranged side by side in the X-axis direction. The connection portion 521 connects end portions of the arms 511 and 512 on the positive side of the Y-axis direction. The connection portion 522 connects an end portion of the arm 512 on the negative side of the Y-axis direction with the movable driving electrode 411A. The driving spring 43A' includes protective beams 53 and 54 positioned on both sides of the arm 511 in the X-axis direction, and protective beams 53 and 54 positioned on both sides of the arm 512 in the X-axis direction. Accordingly, to such a configuration, it is possible to reduce shape deviation of the arms 511 and 512 by the above-described effects.

Next, a detection spring 46A' in FIG. 3 will be described as the representative of the detection springs 46A and 46B. As illustrated in FIG. 14, the detection spring 46A' includes five arms 511, 512, 513, 514, and 515, a connection portion 521, a connection portion 522, a connection portion 523, a connection portion 524, and an arm 55. The arms 511, 512, 513, 514, and 515 extend in the Y-axis direction and are arranged side by side in the X-axis direction. The connection portion 521 connects end portions of the arms 511 and 512 on the negative side of the Y-axis direction. The connection portion 522 connects end portions of the arms 512 and 513 on the positive side of the Y-axis direction. The connection portion 523 connects end portions of the arms 513 and 514 on the negative side of the Y-axis direction. The connection portion 524 connects end portions of the arms 514 and 515 on the positive side of the Y-axis direction. The arm 55 connects the end portion of the arm 515 on the negative side of the Y-axis direction with the movable detection electrode 441A.

The detection spring 46A' includes protective beams 53 and 54 positioned on both sides of the arm 512 in the X-axis direction, protective beams 53 and 54 positioned on both sides of the arm 513 in the X-axis direction, protective beams 53 and 54 positioned on both sides of the arm 514 in the X-axis direction, and protective beams 53 and 54 positioned on both sides of the arm 515 in the X-axis direction. Accordingly to such a configuration, it is possible to reduce shape deviation of the arms 512, 513, 514, and 515 by the above-described effects. The protective beams 53 and 54 are disposed on both sides of the arm 511. However, instead, protruding portions 452a and 452b that protrude from the fixation portion 452 are disposed. Thus, it is possible to reduce the mask opening width Dm at this portion. In addition, similar to the other arms 512, 513, 514, and 515, it is possible to reduce shape deviation of the arm 511.

Next, a connection spring 40A will be described as the representative of the connection springs 40A and 40B. As illustrated in FIG. 15, the connection spring 40A includes a first portion 40A' and a second portion 40A". The first portion 40A' includes three arms 511, 512, and 513, a connection portion 521, a connection portion 522, and a connection portion 523. The arms 511, 512, and 513 extend in the Y-axis direction and are arranged side by side in the X-axis direction. The connection portion 521 connects the end portion of the arm 511 on the positive side of the Y-axis direction with the frame 48. The connection portion 522 connects end portions of the arms 511 and 512 on the negative side of the Y-axis direction. The connection portion 523 connects end portions of the arms 512 and 513 on the positive side of the Y-axis direction. The second portion 40A" includes three arms 514, 515, and 516, a connection portion 524, a connection portion 525, and a connection portion 526. The arms 514, 515, and 516 extend in the Y-axis direction and are arranged side by side in the X-axis direction. The connection portion 524 connects the end portion of the arm 514 on the negative side of the Y-axis direction with the frame 48. The connection portion 525 connects end portion of the arms 514 and 515 on the positive side of the Y-axis direction. The connection portion 526 connects end portions of the arms 515 and 516 on the negative side of the Y-axis direction. The connection spring 40A includes a connection portion 57 that connects the tip portions of the arms 513 and 516 with the movable detection electrode 441A.

The first portion 40A' includes protective beams 53 and 54 positioned on both sides of the arm 511 in the X-axis direction, protective beams 53 and 54 positioned on both sides of the arm 512 in the X-axis direction, and protective beams 53 and 54 positioned on both sides of the arm 513 in the X-axis direction. Similarly, the second portion 40A" includes protective beams 53 and 54 positioned on both sides of the arm 514 in the X-axis direction, protective beams 53 and 54 positioned on both sides of the arm 515 in the X-axis direction, and protective beams 53 and 54 positioned on both sides of the arm 516 in the X-axis direction. Accordingly to such a configuration, it is possible to reduce shape deviation of the arms 511, 512, 513, 514, 515, and 516 by the above-described effects.

Hitherto, the driving springs 43A and 43B, the detection springs 46A and 46B, and the connection springs 40A and 40B in this embodiment, to which the spring 5 has been applied are described. However, the configurations thereof are not particularly limited. Each of the springs may include one arm 51 and any one of protective beams 53 and 54 corresponding to the arm 51. At least one of the driving springs 43A and 43B, the detection springs 46A and 46B, and the connection springs 40A and 40B may not include the protective beams 53 and 54. The deviation of the cross-sectional shape most affects the occurrence of the quadrature in the driving springs 43A and 43B, and next affects the occurrence of the quadrature in the detection springs 46A and 46B. In addition, the deviation of the cross-sectional shape has difficulty in affecting the occurrence of the quadrature in the connection springs 40A and 40B. Therefore, for example, a configuration in which the configuration of the spring 5, in which the protective beams 53 and 54 are provided is applied to the driving springs 43A and 43B and the detection springs 46A and 46B, and the protective beam 53 is not provided in the connection springs 40A and 40B may be made.

The physical quantity sensor 1 is described above. As described above, the physical quantity sensor 1 includes the movable bodies 4A and 4B and the springs 5 (driving springs 43A and 43B, detection springs 46A and 46B, and connection springs 40A and 40B) that supports the movable bodies 4A and 4B. The spring 5 includes the arm 51 having an elongate shape in the Y-axis direction (first direction), and the first beam 531 (541) and the second beam 532 (542) which are adjacent to the arm 51 in the X-axis direction and are disposed in the Y-axis direction. The end portion of the first beam 531 (541) on the second beam 532 (542) side and the end portion of the second beam 532 (542) on the first beam 531 (541) side are arranged side by side in the X-axis direction (second direction) which is orthogonal to the Y-axis direction. According to such a configuration, it is possible to sufficiently reduce the mask opening width Dm in the entirety (in particular, portion arranged side by side with the gap S1) of the arm 51 in the dry etching step of forming the spring 5. Therefore, it is possible to cause the micro-loading effect in the entirety of the arm 51, and to perform machining on the entirety of the arm 51 with high accuracy (verticality of etching). Accordingly, the shape deviation of the arm 51 is reduced, and thus it is possible to effectively reduce the occurrence of the quadrature.

As described above, the first beam 531 (541) and the second beam 532 (542) are disposed on both sides of the arm 51 in the X-axis direction, respectively. That is, the first beam 531 and the second beam 532 are disposed on one side of the arm 51 in the X-axis direction. The first beam 541 and the second beam 542 are disposed on the other side of the arm 51 in the X-axis direction. Thus, it is possible to perform machining on both side surfaces of the arm 51 with high accuracy (verticality of etching). Therefore, the shape deviation of the arm 51 is more effectively reduced, and it is possible to more effectively reduce the occurrence of the quadrature.

As described above, the first beam 531 includes the first portion 5311 having an elongate shape in the Y-axis direction, the second portion 5312 which has an elongate shape in the Y-axis direction and is disposed to be shifted from the first portion 5311 in the X-axis direction, and the third portion 5313 that connects the first portion 5311 and the second portion 5312. Thus, the configuration of the first beam 531 is simplified. This is similarly applied to the first beam 541.

Second Embodiment

Next, a physical quantity sensor according to a second embodiment will be described.

Figure 16:
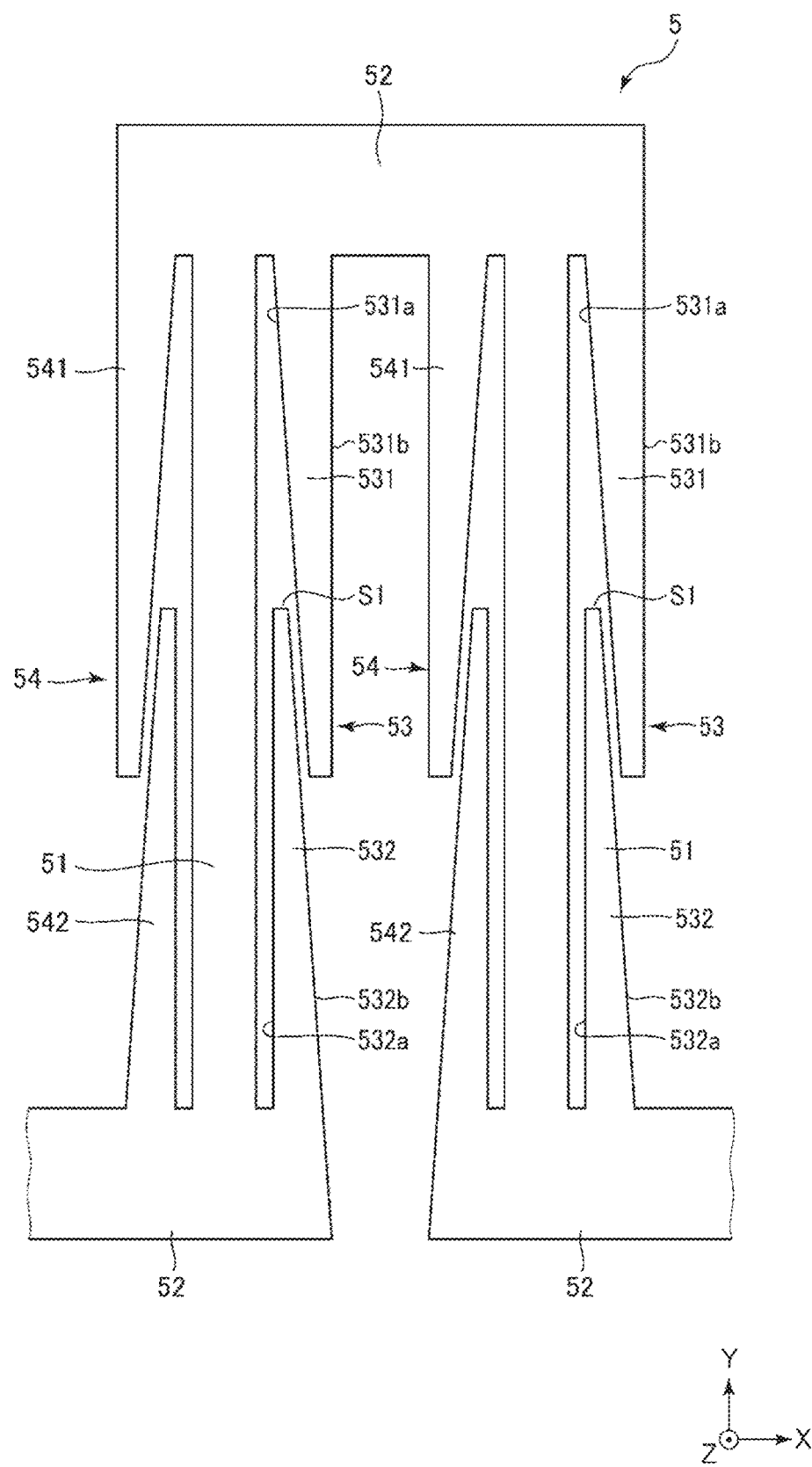
FIG. 16 is a plan view illustrating a spring provided in a physical quantity sensor according to a second embodiment.
Figure 17:
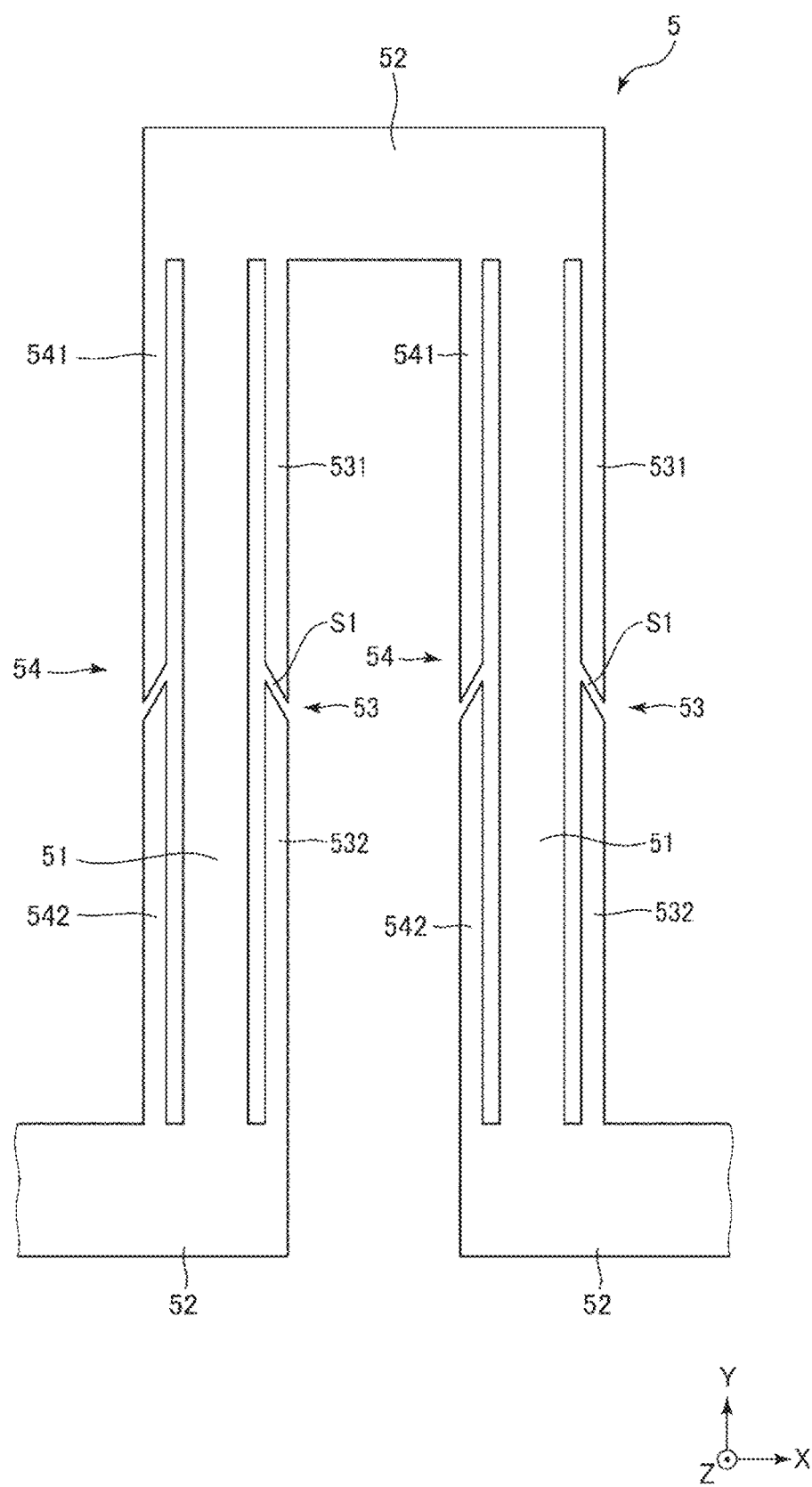
FIG. 17 is a plan view illustrating a modification example of the spring illustrated in FIG. 16.

FIG. 16 is a plan view illustrating a spring provided in the physical quantity sensor according to the second embodiment. FIG. 17 is a plan view illustrating a modification example of the spring illustrated in FIG. 16.

The physical quantity sensor in this embodiment is similar to the above-described physical quantity sensor according to the first embodiment except that a configuration of the spring 5 is different from that in the first embodiment. In the following descriptions, the physical quantity sensor in the second embodiment will be described focusing on a difference from the above-described first embodiment, and descriptions of the similar items will not be repeated. In FIGS. 16 and 17, the same components as those in the above-described embodiment are denoted by the same reference signs. In this embodiment, the protective beams 53 and 54 have configurations similar to each other. Thus, in the following descriptions, the protective beam 53 as the representative will be described. Descriptions of the protective beam 54 will be omitted.

As illustrated in FIG. 16, in the protective beam 53 in this embodiment, each of the first beam 531 and the second beam 532 extends straight in the Y-axis direction. Tip portions of the first beam and the second beam are disposed in the X-axis direction. That is, the tip of the first beam 531 is positioned closer to the proximal end side of the second beam 532 than the tip side thereof. The tip of the second beam 532 is positioned closer to the proximal end side of the first beam 531 than the tip side thereof. Therefore, similar to the above-described first embodiment, the tip portion of the first beam 531 is positioned so as to face the arm 51 with the gap S1 interposed between the first beam 531 and the second beam 532. Thus, it is possible to cause the micro-loading effect even in the gap S1, and to effectively reduce the shape deviation of the arm 51, in the dry etching step of forming the sensor element 4.

Each of the first beam 531 and the second beam 532 has a tapered shape having a width (length in the X-axis direction) which gradually decreases from the proximal end toward the tip. Thus, the masses of the first beam 531 and the second beam 532 on the tip side are reduced, and breaking of the first beam 531 and the second beam 532 occurs less frequently.

The first beam 531 has a one-tapered shape in which only one side surface 531a is inclined, in a manner that the side surface 531a on the arm 51 side is set to be a surface inclined about the Z axis from the YZ plane, and the side surface 531b on an opposite side of the arm 51 is set to be a surface on the YZ plane. Similarly, the second beam 532 has a one-tapered shape in which only one side surface 532b is inclined, in a manner that the side surface 532a on the arm 51 side is set to be a surface on the YZ plane, and the side surface 532b on an opposite side of the arm 51 (that is, a side facing the first beam 531) is set to be a surface inclined about the Z axis from the YZ plane. The side surfaces 531a and 532b facing each other are parallel to each other. As described above, since the side surfaces of the first beam 531 and the second beam 532, which face each other are inclined, it is possible to arrange the first beam 531 and the second beam 532 to be nearer to each other, and to save the space.

As described above, in the physical quantity sensor 1 in this embodiment, the end portion of the first beam 531 on the second beam 532 side has a width (length in the X-axis direction) which gradually decreases toward the second beam 532. The end portion of the second beam 532 on the first beam 531 side has a width (length in the X-axis direction) which gradually decreases toward the first beam 531. Thus, the masses of the first beam 531 and the second beam 532 on the tip side are reduced, and breaking of the first beam 531 and the second beam 532 occurs less frequently.

As described above, in the end portion of the first beam 531 on the second beam 532, in plan view in the Z-axis direction (third direction) orthogonal to the Y-axis direction and the X-axis direction, the side surface 531a (surface on a side facing the second beam 532) is inclined from the Y-axis direction. In the end portion of the second beam 532 on the first beam 531 side, in plan view in the Z-axis direction, the side surface 532b (surface on a side facing the first beam 531) is inclined from the Y-axis direction. As described above, since the side surfaces of the first beam 531 and the second beam 532, which face each other are inclined, it is possible to arrange the first beam 531 and the second beam 532 to be nearer to each other, and to save the space.

With such a second embodiment, it is also possible to exhibit effects similar to those in the above-described first embodiment. In this embodiment, each of the first beam 531 and the second beam 532 has a tapered shape in the entirety thereof in the longitudinal direction. However, the invention is not limited thereto. For example, as illustrated in FIG. 17, only the tip portion has a tapered shape.

Third Embodiment

Next, a physical quantity sensor according to a third embodiment will be described.

Figure 18:
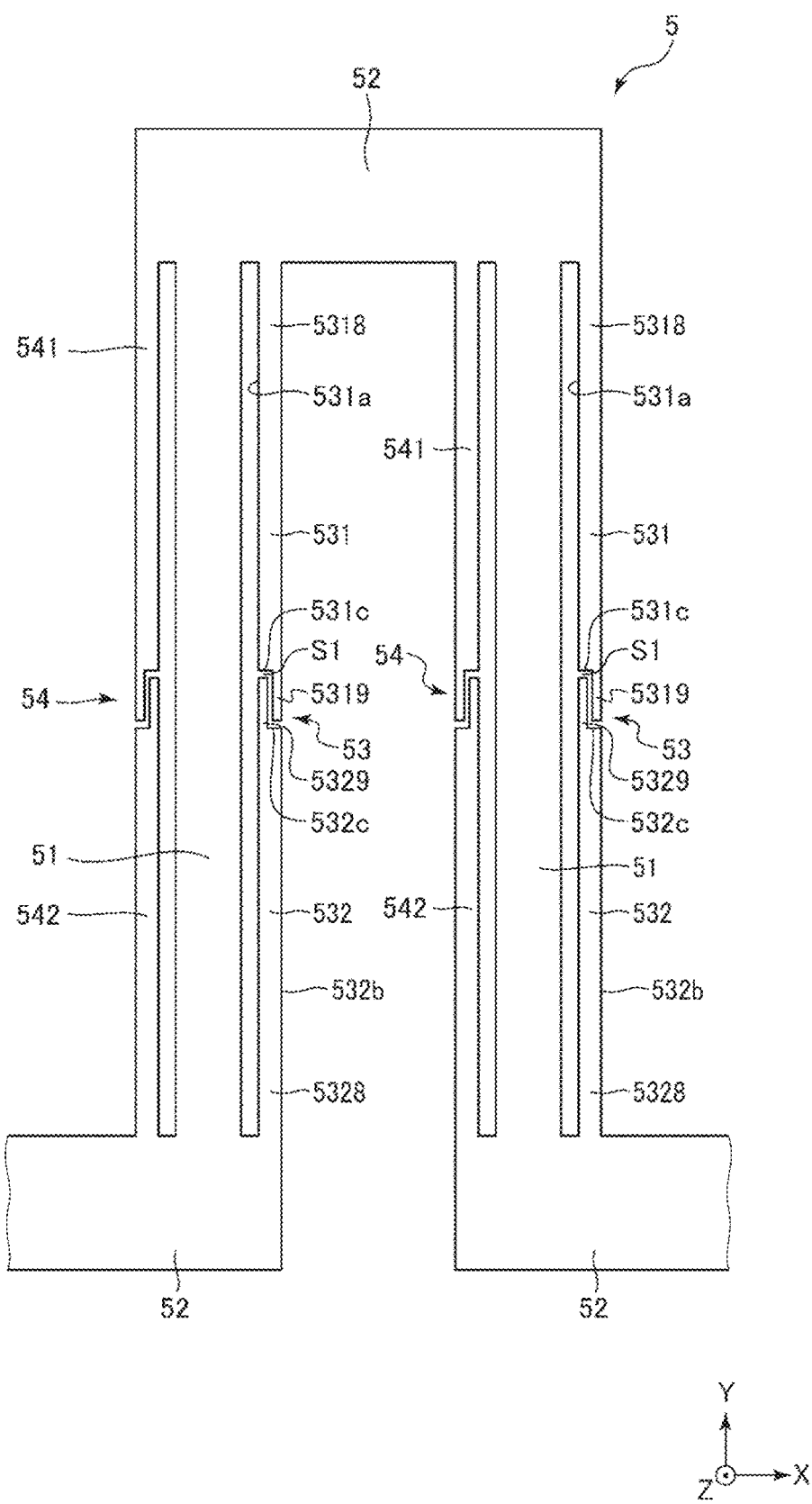
FIG. 18 is a plan view illustrating a spring provided in a physical quantity sensor according to a third embodiment.
Figure 19:
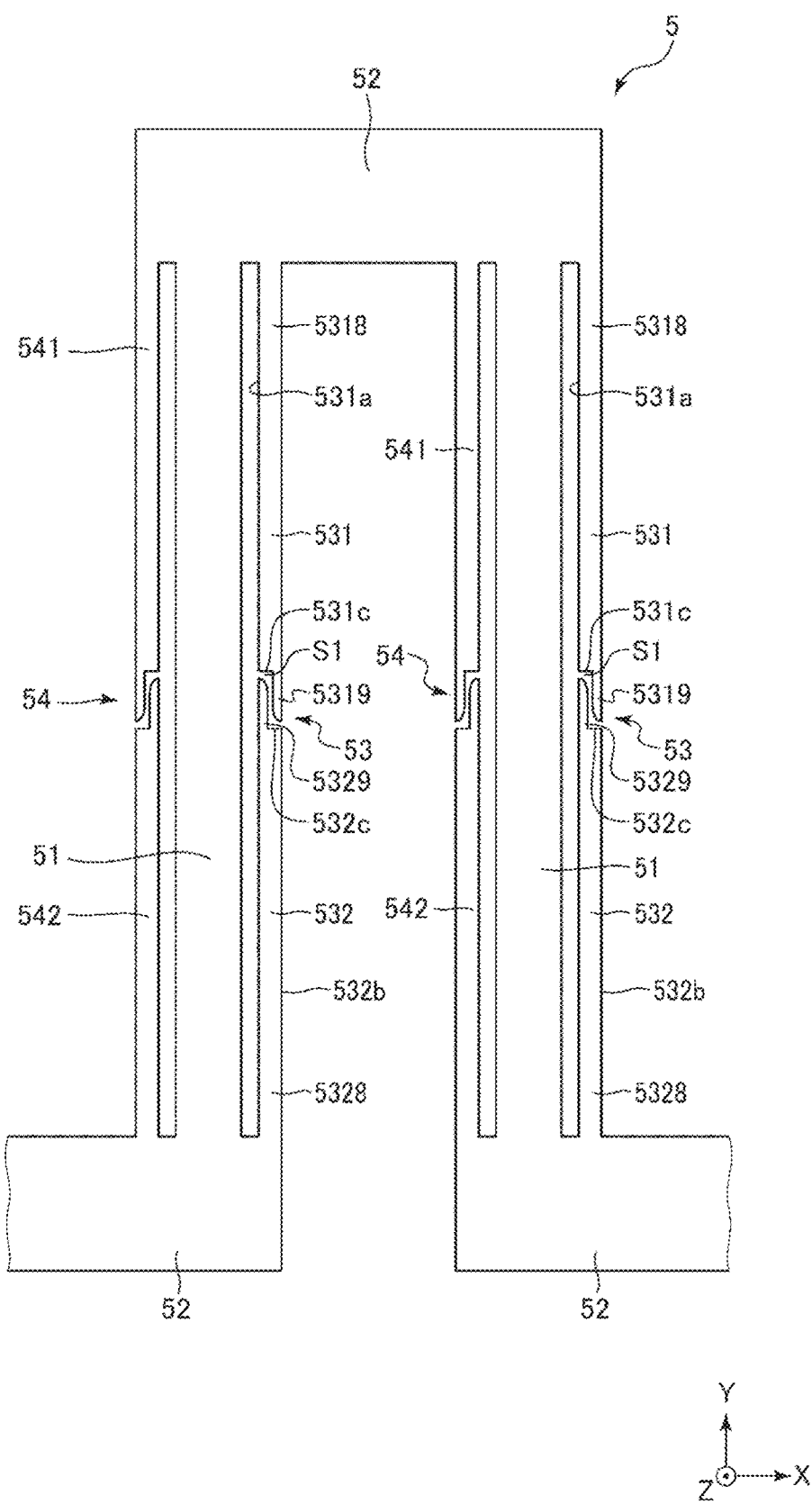
FIG. 19 is a plan view illustrating a modification example of the spring illustrated in FIG. 18.

FIG. 18 is a plan view illustrating a spring provided in the physical quantity sensor according to the third embodiment. FIG. 19 is a plan view illustrating a modification example of the spring illustrated in FIG. 18.

The physical quantity sensor in this embodiment is similar to the above-described physical quantity sensor according to the first embodiment except that a configuration of the spring 5 is different from that in the first embodiment. In the following descriptions, the physical quantity sensor in the third embodiment will be described focusing on a difference from the above-described first embodiment, and descriptions of the similar items will not be repeated. In FIGS. 18 and 19, the same components as those in the above-described embodiment are denoted by the same reference signs. In this embodiment, the protective beams 53 and 54 have configurations similar to each other. Thus, in the following descriptions, the protective beam 53 as the representative will be described. Descriptions of the protective beam 54 will be omitted.

As illustrated in FIG. 18, in the protective beam 53 in this embodiment, each of the first beam 531 and the second beam 532 extends straight in the Y-axis direction. Tip portions of the first beam and the second beam are disposed in the X-axis direction. That is, the tip of the first beam 531 is positioned closer to the proximal end side of the second beam 532 than the tip side thereof. The tip of the second beam 532 is positioned closer to the proximal end side of the first beam 531 than the tip side thereof. Therefore, similar to the above-described first embodiment, the tip portion of the first beam 531 is positioned so as to face the arm 51 with the gap S1 interposed between the first beam 531 and the second beam 532. Thus, it is possible to cause the micro-loading effect even in the gap S1, and to effectively reduce the shape deviation of the arm 51, in the dry etching step of forming the sensor element 4.

The first beam 531 includes a base portion 5318 and a protruding portion 5319. The base portion 5318 is positioned on the proximal end side and has an elongate shape in the Y-axis direction. The protruding portion 5319 protrudes from the tip of the base portion 5318. Each of the base portion 5318 and the protruding portion 5319 has a width in the longitudinal direction, which is substantially constant. The width of the protruding portion 5319 is smaller than the width of the base portion 5318. Similarly, the second beam 532 includes a base portion 5328 and a protruding portion 5329. The base portion 5328 is positioned on the proximal end side and has an elongate shape in the Y-axis direction. The protruding portion 5329 protrudes from the tip of the base portion 5328. Each of the base portion 5328 and the protruding portion 5329 has a width in the longitudinal direction, which is substantially constant. The width of the protruding portion 5329 is smaller than the width of the base portion 5328. As described above, since the protruding portions 5319 and 5329 positioned on the tip side are set to be thinner than the base portions 5318 and 5328 positioned on the proximal end side, the masses of the first and second beams 531 and 532 on the tip side are reduced, and breaking of the first and second beams 531 and 532 occurs less frequently.

The protruding portions 5319 and 5329 are disposed in the X-axis direction. Thus, the tip portion of the first beam 531 can be positioned to face the arm 51 with the gap S1 interposed between the tip portion thereof and the arm 51.

In the first beam 531, the protruding portion 5319 is provided to be biased toward a side of the base portion 5318, which is opposite to the arm 51. A step 531c is formed on the side surface 531a thereof on the arm 51 side. Conversely, in the second beam 532, the protruding portion 5329 is provided to be biased toward a side of the base portion 5328, which is opposite to the arm 51. A step 532*c* is formed on the side surface 532*b* on an opposite side of the arm 51. The first and second beams 531 and 532 are disposed in a manner that the protruding portion 5319 of the first beam 531 is positioned on the step 532*c* of the second beam 532, and the protruding portion 5329 of the second beam 532 is positioned on the step 531*c* of the first beam 531. Thus, it is possible to arrange the first beam 531 and the second beam 532 so as to be closer to each other, and to save a space.

As described above, in the physical quantity sensor 1 in this embodiment, the first beam 531 includes the base portion (first base portion) 5318 and the protruding portion (first protruding portion) 5319 which protrudes from the base portion 5318 toward the second beam 532 and has a width (length in the X-axis direction) smaller than that of the base portion 5318. Similarly, the second beam 532 includes the base portion (second base portion) 5318 and the protruding portion (second protruding portion) 5329 which protrudes from the base portion 5328 toward the first beam 531 side and has a width (length in the X-axis direction) smaller than that of the base portion 5328. The protruding portion 5319 and the protruding portion 5329 are arranged side by side in the X-axis direction. Thus, the configuration of each of the first beam 531 and the second beam 532 is simplified. This is similarly applied to the first beam 541 and the second beam 542.

As described above, the protruding portion 5319 is disposed to be biased toward a side of the base portion 5318, which is opposite to the protruding portion 5329. The protruding portion 5329 is disposed to be biased toward a side of the base portion 5328, which is opposite to the protruding portion 5319. Thus, it is possible to arrange the first beam 531 and the second beam 532 so as to be closer to each other, and to save a space.

With such a third embodiment, it is also possible to exhibit effects similar to those in the above-described first embodiment. As a modification example of this embodiment, for example, as illustrated in FIG. 19, the corner of the protruding portion 5319 on a side thereof facing the protruding portion 5329 may be chamfered, and the corner of the protruding portion 5329 on a side thereof facing the protruding portion 5319 may be chamfered. Thus, it is possible to effectively reduce a damage (in particular, defects) of the protruding portions 5319 and 5329 when the protruding portions 5319 and 5329 are brought into contact with each other.

Fourth Embodiment

Next, a physical quantity sensor according to a fourth embodiment will be described.

Figure 20:
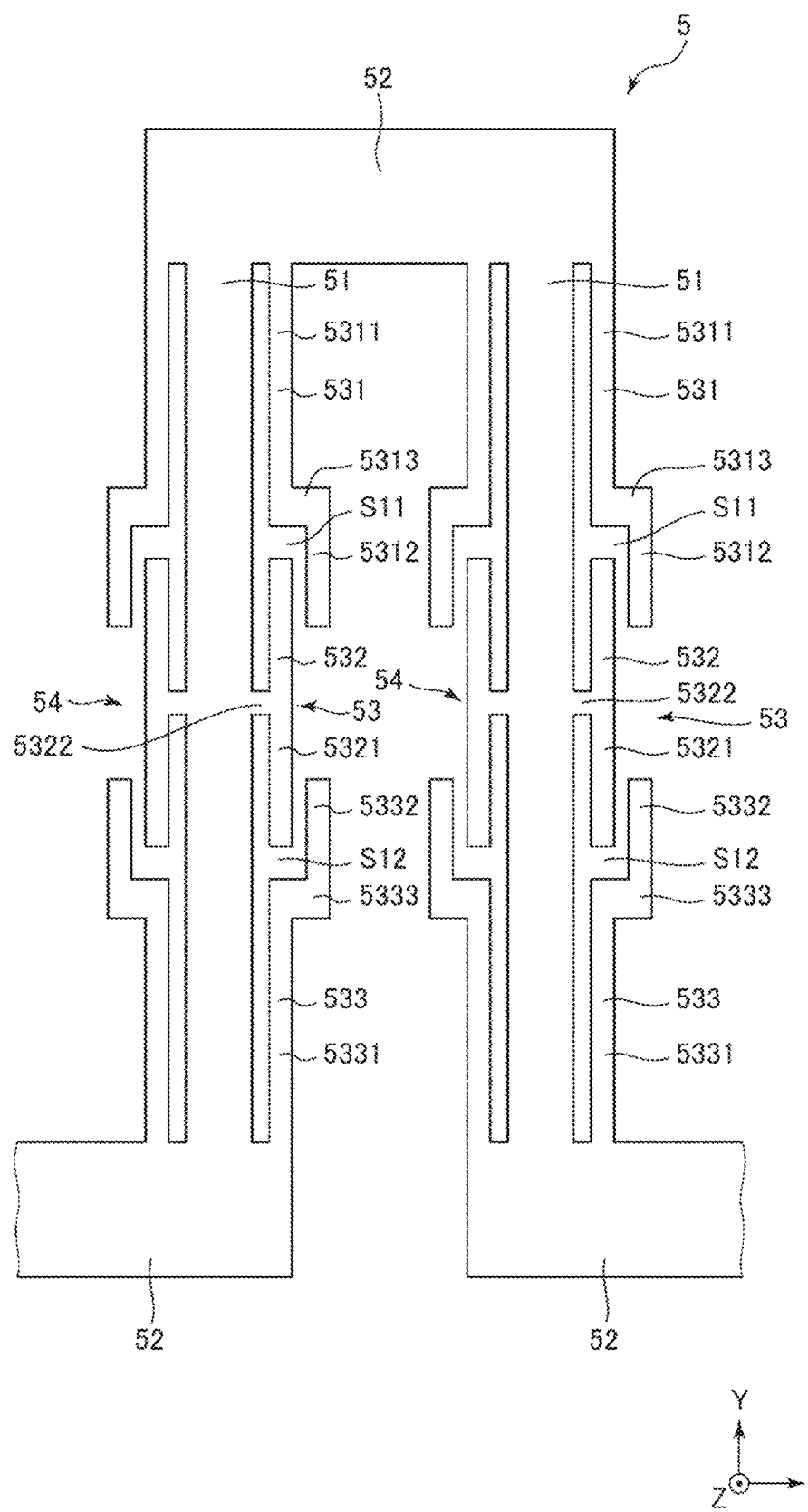
FIG. 20 is a plan view illustrating a spring provided in a physical quantity sensor according to a fourth embodiment.

FIG. 20 is a plan view illustrating a spring provided in the physical quantity sensor according to the fourth embodiment.

The physical quantity sensor in this embodiment is similar to the above-described physical quantity sensor according to the first embodiment except that a configuration of the spring 5 is different from that in the first embodiment. In the following descriptions, the physical quantity sensor in the fourth embodiment will be described focusing on a difference from the above-described first embodiment, and descriptions of the similar items will not be repeated. In FIG. 20, the same components as those in the above-described embodiments are denoted by the same reference signs. In this embodiment, the protective beams 53 and 54 have configurations similar to each other. Thus, in the following descriptions, the protective beam 53 as the representative will be described. Descriptions of the protective beam 54 will be omitted.

As illustrated in FIG. 20, the protective beam 53 in this embodiment includes the first beam 531, the second beam 532, and a third beam 533. The first beam 531 is positioned on a side of the second beam 532 on the positive side of the Y-axis direction. The third beam 533 is positioned on a side of the second beam 532 on the negative side of the Y-axis direction. That is, the second beam 532 is disposed between the first beam 531 and the third beam 533. As described above, since the protective beam 53 is divided into three beams, it is possible to shorten the length of each of the beams 531, 532, and 533. In addition, mechanical strength of the protective beam 53 is improved as much as the beams become short, and breaking of the protective beam 53 occurs less frequently.

The first beam 531 has a shape similar to that in the above-described first embodiment, and has a crank-like shape including the first portion 5311, the second portion 5312, and the third portion 5313. The third beam 533 has a shape which is symmetrical with the first beam 531 with respect to the second beam 532. The third beam has a crank-like shape including a first portion 5331, a second portion 5332, and a third portion 5333. The second beam 532 includes a base portion 5321 extending in the Y-axis direction and a connection portion 5322 that connects the center portion of the base portion 5321 and the arm 51, and has a T-shape. The base portion 5321 is positioned between the first portions 5311 and 5331. The first portions 5311 and 5331 are arranged side by side in the Y-axis direction. Thus, a gap S11 is formed between the base portion 5321 and the first portion 5311, and a gap S12 is formed between the base portion 5321 and the first portion 5331.

The second portion 5312 and the tip portion of the base portion 5321 on the positive side of the Y-axis direction are disposed in the X-axis direction. The second portion 5332 and the tip portion of the base portion 5321 on the negative side of the Y-axis direction are disposed in the X-axis direction. Therefore, the second portion 5312 is disposed to face the arm 51 with the gap S11 interposed between the second portion 5312 and the arm 51. The second portion 5332 is disposed to face the arm 51 with the gap S12 interposed between the second portion 5332 and the arm 51. Thus, it is possible to cause the micro-loading effect even in the gaps S11 and S12, and to effectively reduce the shape deviation of the arm 51, in the dry etching step of forming the sensor element 4.

As described above, the physical quantity sensor 1 in this embodiment includes the third beam 533 positioned on the opposite side of the first beam 531 with respect to the second beam 532. The end portion of the second beam 532 on the third beam 533 side and the end portion of the third beam 533 on the second beam 532 side are arranged side by side in the X-axis direction. As described above, since the protective beam 53 is divided into three beams, it is possible to shorten the length of each of the beams 531, 532, and 533. In addition, mechanical strength of the protective beam 53 is improved as much as the beams become short, and breaking of the protective beam 53 occurs less frequently. This is similarly applied to the protective beam 54.

With such a fourth embodiment, it is also possible to exhibit effects similar to those in the above-described first embodiment.

Fifth Embodiment

Next, a physical quantity sensor according to a fifth embodiment will be described.

Figure 21:
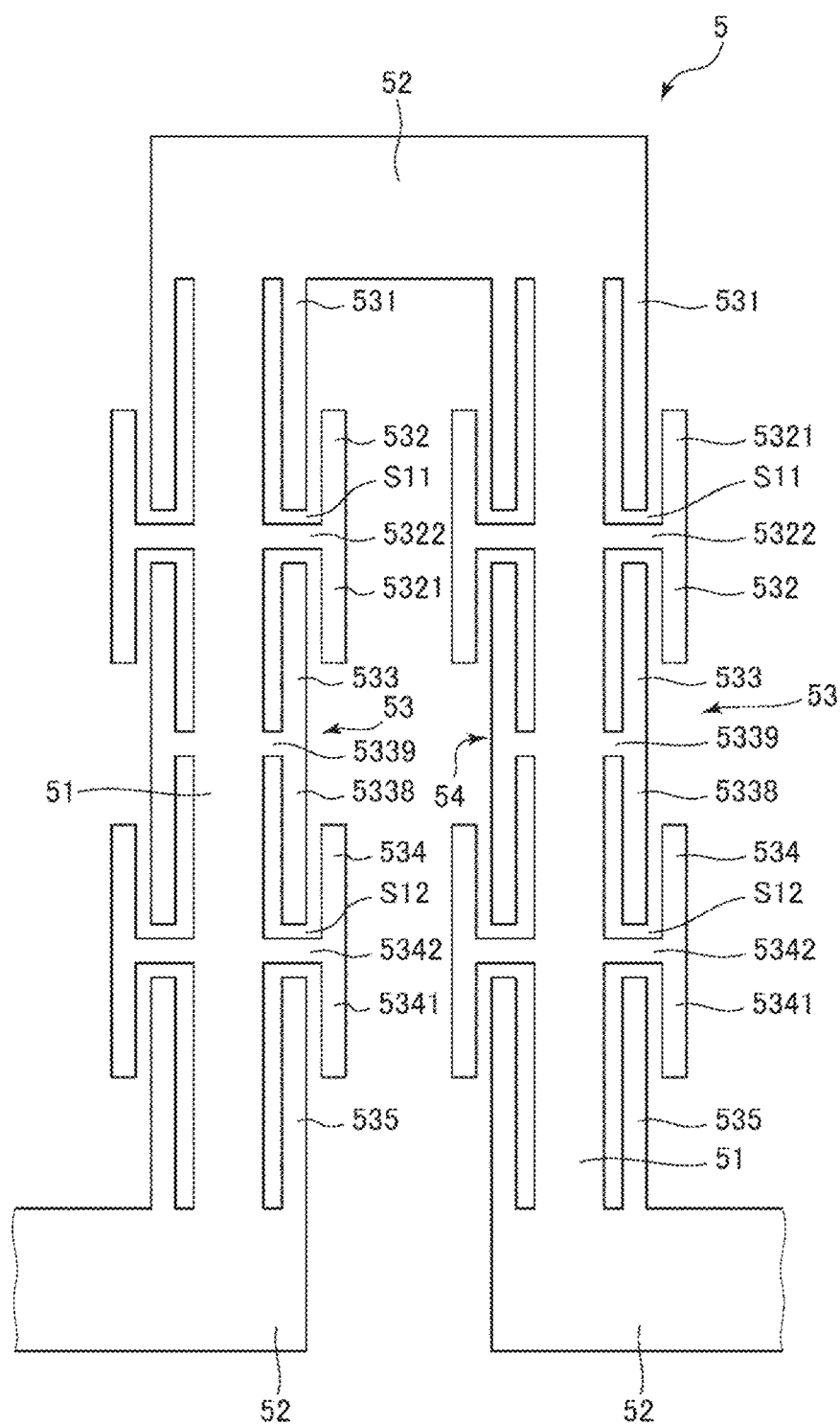
FIG. 21 is a plan view illustrating a spring provided in a physical quantity sensor according to a fifth embodiment.

FIG. 21 is a plan view illustrating a spring provided in the physical quantity sensor according to the fifth embodiment.

The physical quantity sensor in this embodiment is similar to the above-described physical quantity sensor according to the first embodiment except that a configuration of the spring 5 is different from that in the first embodiment. In the following descriptions, the physical quantity sensor in the fifth embodiment will be described focusing on a difference from the above-described first embodiment, and descriptions of the similar items will not be repeated. In FIG. 21, the same components as those in the above-described embodiments are denoted by the same reference signs. In this embodiment, the protective beams 53 and 54 have configurations similar to each other. Thus, in the following descriptions, the protective beam 53 as the representative will be described. Descriptions of the protective beam 54 will be omitted.

As illustrated in FIG. 21, the protective beam 53 in this embodiment includes the first beam 531, the second beam 532, the third beam 533, a fourth beam 534, and a fifth beam 535. The second beam 532 includes abase portion 5321 extending in the Y-axis direction and a connection portion 5322 that connects the center portion of the base portion 5321 and the arm 51, and has a T-shape. The fourth beam 534 is disposed on a side of such a second beam 532 on the negative side of the Y-axis direction. The fourth beam 534 has a configuration similar to that of the second beam 532. The fourth beam 534 includes a base portion 5341 extending in the Y-axis direction and a connection portion 5342 that connects the center portion of the base portion 5341 and the arm 51 and has a T-shape.

The first beam 531 is disposed on a side of the second beam 532 on the positive side of the Y-axis direction. The first beam 531 has an elongate shape in the Y-axis direction. The end portion of the first beam 531 on the positive side of the Y-axis direction is connected to the connection portion 52. The first beam 531 extends to a space between the base portion 5321 of the second beam 532 and the arm 51. The tip portion of the first beam 531 and the tip portion of the base portion 5321 on the positive side of the Y-axis direction are arranged in the X-axis direction.

The third beam 533 is positioned between the second beam 532 and the fourth beam 534. The third beam 533 includes a base portion 5338 extending in the Y-axis direction and a connection portion 5339 that connects the center portion of the base portion 5338 and the arm 51 and has a T-shape. The base portion 5338 has one end portion which extends to the space between the base portion 5321 and the arm 51 and the other end portion which extends to a space between the base portion 5341 and the arm 51. The tip portion of the base portion 5338 on the positive side of the Y-axis direction and the tip portion of the base portion 5321 on the negative side of the Y-axis direction are disposed in the X-axis direction. The tip portion of the base portion 5338 on the negative side of the Y-axis direction and the tip portion of the base portion 5341 on the positive side of the Y-axis direction are disposed in the X-axis direction.

The fifth beam 535 is disposed on a side of the fourth beam 534 on the negative side of the Y-axis direction. The fifth beam 535 has an elongate shape extending in the Y-axis direction. The end portion of the fifth beam 535 on the negative side of the Y-axis direction is connected to the connection portion 52. The fifth beam 535 extends to a space between the base portion 5341 of the fourth beam 534 and the arm 51. The tip portion of the fifth beam 535 and the tip portion of the base portion 5341 on the negative side of the Y-axis direction are disposed in the X-axis direction.

As described above, in the protective beam 53, the base portion 5321 of the second beam 532 is disposed to face the arm 51 with the gap S11 formed between the first beam 531 and the base portion 5338 of the third beam 533. The base portion 5341 of the fourth beam 534 is disposed to face the arm 51 with the gap S12 formed between the base portion 5338 of the third beam 533 and the fifth beam 535. Therefore, it is possible to cause the micro-loading effect even in the gaps S11 and S12, and to effectively reduce the shape deviation of the arm 51, in the dry etching step of forming the sensor element 4.

With such a fifth embodiment, it is also possible to exhibit effects similar to those in the above-described first embodiment.

Sixth Embodiment

Next, a physical quantity sensor according to a sixth embodiment will be described.

Figure 22:
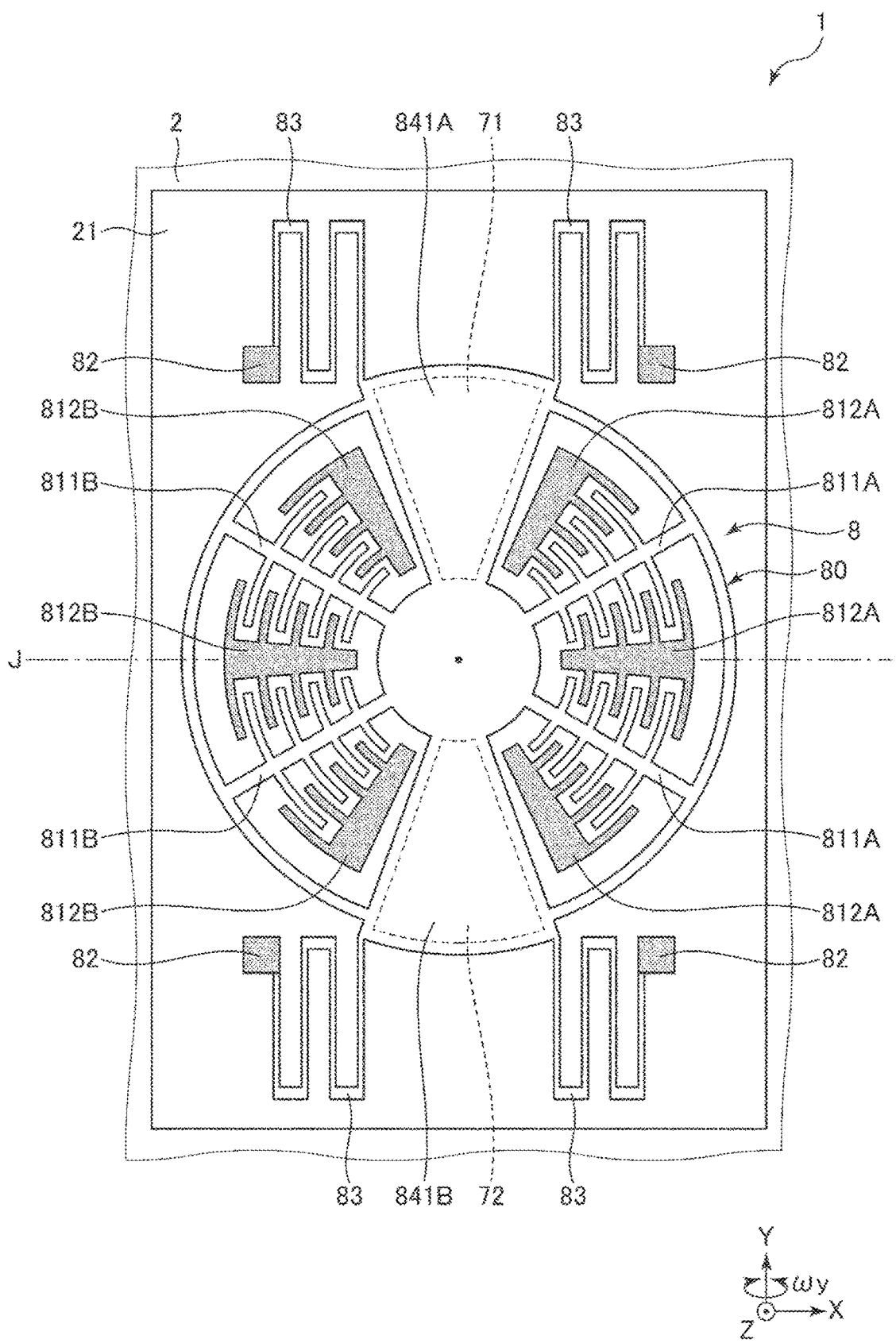
FIG. 22 is a plan view illustrating a physical quantity sensor according to a sixth embodiment.

FIG. 22 is a plan view illustrating the physical quantity sensor according to the sixth embodiment.

A physical quantity sensor 1 in this embodiment is similar to the above-described physical quantity sensor 1 according to the first embodiment except that a configuration of the sensor element 8 is different from that in the first embodiment. In the following descriptions, the physical quantity sensor 1 in the sixth embodiment will be described focusing on a difference from the above-described first embodiment, and descriptions of the similar items will not be repeated. In FIG. 22, the same components as those in the above-described first embodiment are denoted by the same reference signs. In FIG. 22, for easy descriptions, illustrations of the wirings 73 to 78 are omitted.

The sensor element 8 includes a movable body 80, fixation portions 82, and four sprints 83. The movable body 80 has an outer shape which is substantially circular. The fixation portions 82 are positioned around the movable body 80 and are fixed to the substrate 2. The springs 83 connect the movable body 80 with the fixation portions 82, respectively. The above-described configuration of the spring 5 can be applied to the four springs 83.

The movable body 80 includes a movable detection electrode 841A positioned on the positive side of the Y-axis direction with respect to the center O, and a movable detection electrode 841B positioned on the negative side of the Y-axis direction. The fixed detection electrode 71 facing the movable detection electrode 841A and the fixed detection electrode 72 facing the movable detection electrode 841B are disposed on the bottom surface of the recess portion 21. When the physical quantity sensor 1 drives, electrostatic capacitance Ca is formed between the movable detection electrode 841A and the fixed detection electrode 71, and electrostatic capacitance Cb is formed between the movable detection electrode 841B and the fixed detection electrode 72. The movable body 80 includes a movable driving electrode 811A and a movable driving electrode 811B. The movable driving electrode 811A is positioned on the positive side of the X-axis direction with respect to the center O, and has a comb teeth shape. The movable driving electrode 811B is positioned on the negative side of the X-axis direction and has a comb teeth shape. The sensor element 8 includes a fixed driving electrode 812A and a fixed driving electrode 812B. The fixed driving electrode 812A has a comb teeth shape and is disposed to engage with the movable driving electrode 811A. The fixed driving electrode 812B has a comb teeth shape and is disposed to engage with the movable driving electrode 811B. Each of the fixed driving electrodes 812A and 812B is fixed to the substrate 2.

In such a physical quantity sensor 1, if a driving voltage is applied to the fixed driving electrodes 812A and 812B, the movable body 80 vibrates around the center O (driving vibration mode). If the angular rate ωy is applied to the physical quantity sensor 1 in the process of the movable body 80 vibrating about the center O, the movable body 80 vibrates like a seesaw, about an axis J which passes through the center O and is parallel to the Y axis. The electrostatic capacitance Ca and Cb vary with the vibration (detecting vibration mode). Therefore, the angular rate ωy can be obtained based on the change of the electrostatic capacitance Ca and Cb.

With such a sixth embodiment, it is also possible to exhibit effects similar to those in the above-described first embodiment.

Seventh Embodiment

Next, a physical quantity sensor device according to a seventh embodiment will be described.

Figure 23:
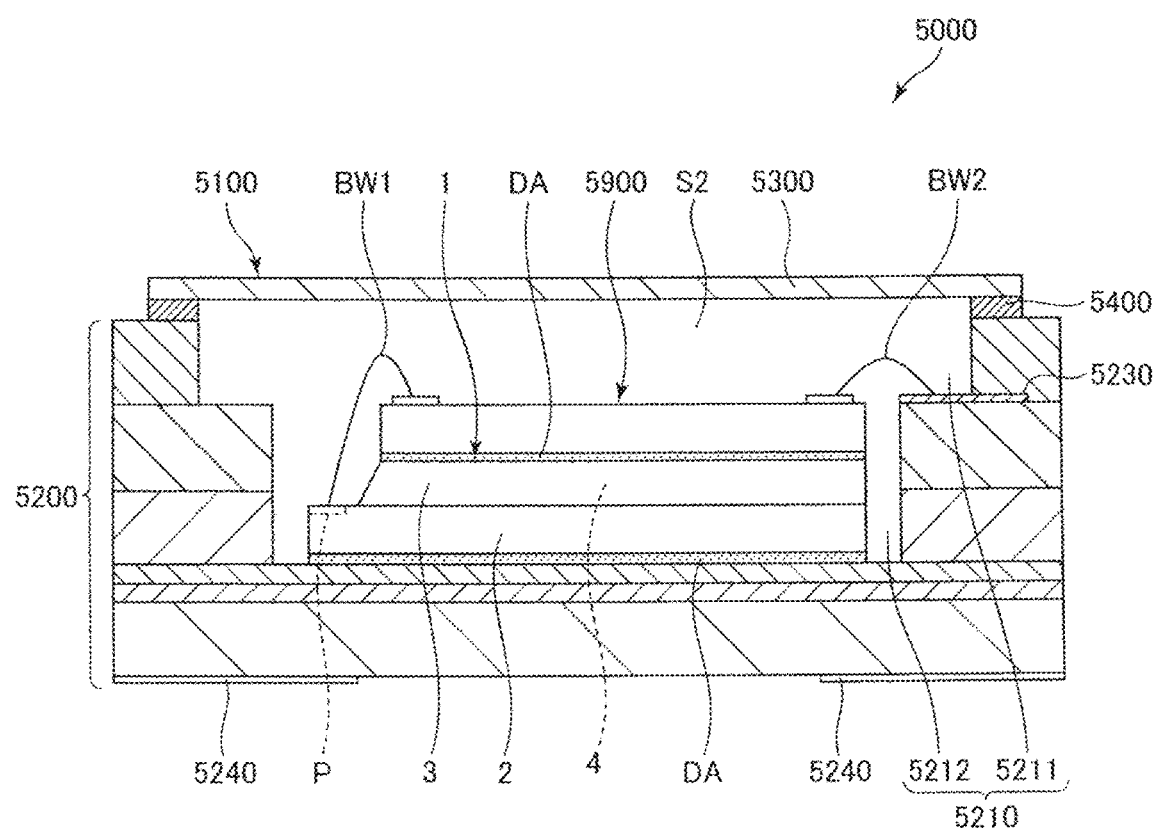
FIG. 23 is a sectional view illustrating a physical quantity sensor device according to a seventh embodiment.

FIG. 23 is a sectional view illustrating the physical quantity sensor device according to the seventh embodiment.

As illustrated in FIG. 23, a physical quantity sensor device 5000 includes a physical quantity sensor 1, a semiconductor element (circuit element) 5900, and a package 5100 that stores the physical quantity sensor 1 and the semiconductor element 5900. For example, the physical quantity sensor in any of the above-described embodiments can be used as the physical quantity sensor 1.

The package 5100 includes a cavity-like base 5200 and a lid 5300 bonded to the upper surface of the base 5200. The base 5200 includes a recess portion 5210 which opens to the upper surface thereof. The recess portion 5210 includes a first recess portion 5211 which opens to the upper surface of the base 5200 and a second recess portion 5212 which opens to the bottom surface of the first recess portion 5211.

The lid 5300 has a plate shape, and is bonded to the upper surface of the base 5200 so as to close the opening of the recess portion 5210. A storage space S2 is formed in the package 5100 by the lid 5300 closing the opening of the recess portion 5210 in this manner, and thus the physical quantity sensor 1 and the semiconductor element 5900 are stored in the storage space S2. A method of bonding the base 5200 and the lid 5300 to each other is not particularly limited. In this embodiment, seam welding using a seam ring 5400 is used.

The storage space S2 is airtightly sealed. The atmosphere of the storage space S2 is not particularly limited. For example, the atmosphere of the storage space S2 is preferably set to be the same as the atmosphere of the storage space S of the physical quantity sensor 1. Thus, it is possible to maintain the atmosphere of the storage space S as it is, even if airtightness of the storage space S collapses, and the storage spaces S and S2 communicate with each other. Therefore, it is possible to reduce variation in detection characteristics of the physical quantity sensor 1, which occurs by changing the atmosphere of the storage space S, and to exhibit the stable detection characteristics.

A material for forming the base 5200 is not particularly limited. For example, various ceramics such as alumina, zirconia, and titania can be used. A material for forming the lid 5300 is not particularly limited. For example, a material having a linear expansion coefficient which is approximate to that of the material for forming the base 5200 may be provided. For example, in a case where the above-described ceramic is provided as the material for forming the base 5200, alloys with cobalt and the like are preferably used.

The base 5200 includes a plurality of internal terminals 5230 arranged in the storage space S2 (on the bottom surface of the first recess portion 5211) and a plurality of external terminals 5240 arranged on the bottom surface of the base. Each of the internal terminals 5230 is electrically connected to the predetermined external terminal 5240 via an internal interconnection (not illustrated) disposed in the base 5200.

The physical quantity sensor 1 is fixed to the bottom surface of the recess portion 5210 via a die-attach material DA. In addition, the semiconductor element 5900 is disposed on the upper surface of the physical quantity sensor 1 with a die-attach material DA interposed between the semiconductor element and the upper surface of the physical quantity sensor. Thus, the physical quantity sensor 1 and the semiconductor element 5900 are electrically connected to each other via the bonding wiring BW1, and the semiconductor element 5900 and the internal terminal 5230 are electrically connected to each other via a bonding wiring BW2.

If necessary, the semiconductor element 5900 includes, for example, a driving circuit that applies a driving voltage to the sensor element 4, a detection circuit that detects the angular rate ωy based on an output from the sensor element 4, or an output circuit that converts a signal from the detection circuit into a predetermined signal and outputs the predetermined signal.

Hitherto, the physical quantity sensor device 5000 is described. Such a physical quantity sensor device 5000 includes the physical quantity sensor 1 and the semiconductor element (circuit element) 5900. Therefore, a physical quantity sensor device 5000 which is capable of exhibiting the effect of the physical quantity sensor 1 and has high reliability is obtained.

Eighth Embodiment

Next, a complex sensor device according to an eighth embodiment will be described.

Figure 24:
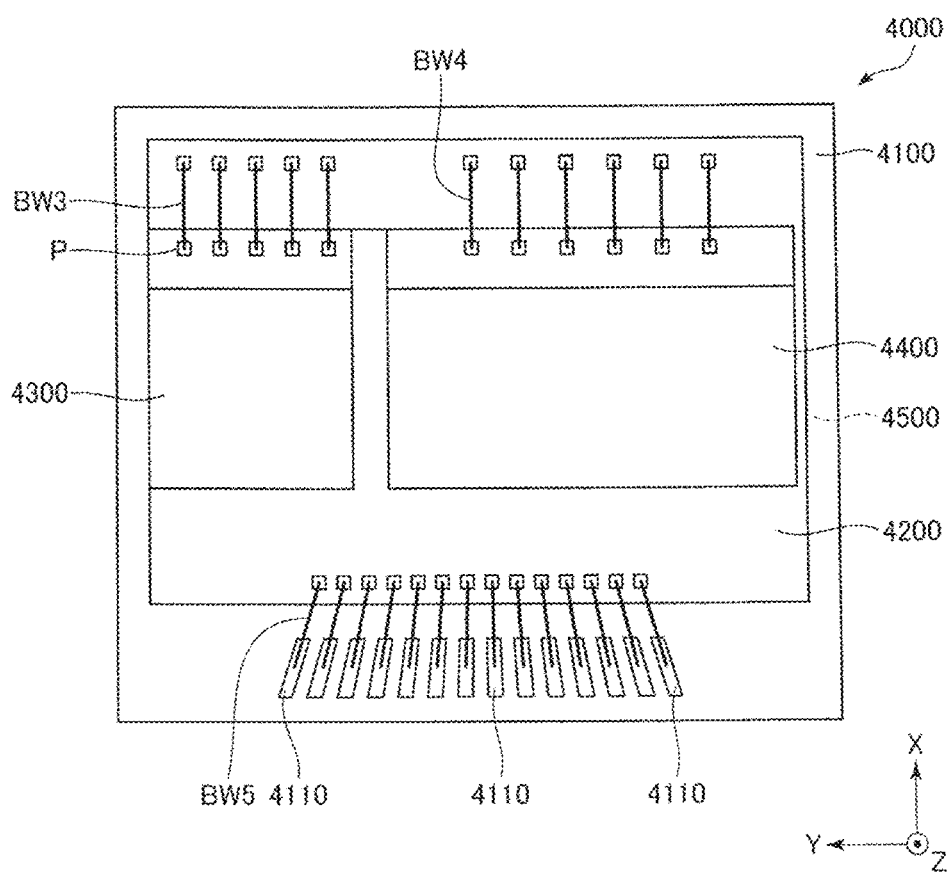
FIG. 24 is a plan view illustrating a complex sensor device according to an eighth embodiment.
Figure 25:
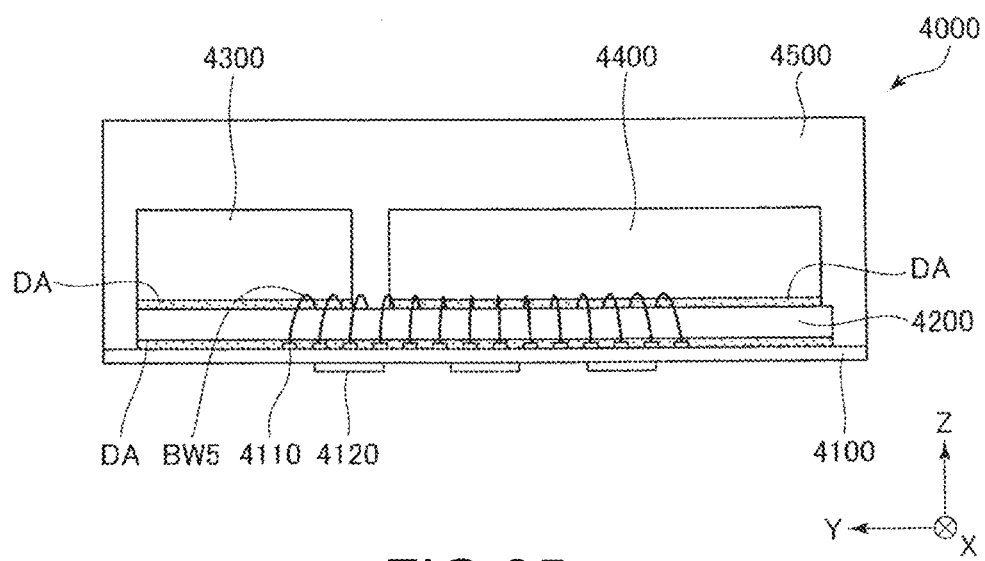
FIG. 25 is a sectional view illustrating the complex sensor device illustrated in FIG. 24.

FIG. 24 is a plan view illustrating the complex sensor device according to the eighth embodiment. FIG. 25 is a sectional view illustrating the complex sensor device illustrated in FIG. 24.

As illustrated in FIGS. 24 and 25, a complex sensor device 4000 includes a base substrate 4100, a semiconductor element (circuit element) 4200, an acceleration sensor (second physical quantity sensor) 4300, an angular rate sensor (first physical quantity sensor) 4400, and a resin package 4500. The semiconductor element is mounted on the upper surface of the base substrate 4100 with a die-attach material (resin adhesive) DA. The acceleration sensor and the angular rate sensor are mounted on the upper surface of the semiconductor element 4200 with a die-attach material. The resin package 4500 covers the semiconductor element 4200, the acceleration sensor 4300, and the angular rate sensor 4400. The acceleration sensor 4300 is a three-axis acceleration sensor capable of independently detecting an acceleration of each of three axes (X axis, Y axis, and Z axis) which are orthogonal to each other. For example, a capacitive sensor can be used. The angular rate sensor 4400 is a three-axis angular rate sensor capable of independently detecting an angular rate of each of three axes (X axis, Y axis, and Z axis) which are orthogonal to each other. The physical quantity sensor 1 can be applied as the angular rate sensor 4400.

The base substrate 4100 includes a plurality of connection terminals 4110 provided on the upper surface of the base substrate and a plurality of external terminals 4120 provided on the lower surface thereof. Each of the connection terminals 4110 is electrically connected to the corresponding external terminal 4120 via an internal interconnection (not illustrated) disposed in the base substrate 4100. The semiconductor element 4200 is disposed on the upper surface of such a base substrate 4100.

If necessary, the semiconductor element 4200 includes a driving circuit, an acceleration detection circuit, an angular-rate detection circuit, an output circuit, and the like. The driving circuit drives the acceleration sensor 4300 and the angular rate sensor 4400. The acceleration detection circuit independently detects each of an acceleration in the X-axis direction, an acceleration in the Y-axis direction, and an acceleration in the Z-axis direction based on an output from the acceleration sensor 4300. The angular-rate detection circuit independently detects each of an angular rate about the X axis, an angular rate about the Y axis, and an angular rate about the Z axis based on the output from the angular rate sensor 4400. The output circuit converts signals from the acceleration detection circuit and the angular-rate detection circuit into predetermined signals, and outputs the predetermined signals.

Such a semiconductor element 4200 is electrically connected to the acceleration sensor 4300 via a bonding wiring BW3, is electrically connected to the angular rate sensor 4400 via a bonding wiring BW4, and is electrically connected to the connection terminal 4110 of the base substrate 4100 via a bonding wiring BW5. The acceleration sensor 4300 and the angular rate sensor 4400 are disposed on the upper surface of such a semiconductor element 4200, in parallel.

Hitherto, the complex sensor device 4000 is described. As described above, such a complex sensor device 4000 includes the angular rate sensor (first physical quantity sensor) 4400 and the acceleration sensor (second physical quantity sensor) 4300 that detects a physical quantity different from that in the angular rate sensor 4400. Thus, a complex sensor device 4000 which is capable of detecting physical quantities having different types and has high convenience is obtained. In particular, in this embodiment, the first physical quantity sensor is the angular rate sensor 4400 capable of detecting an angular rate, and the second physical quantity sensor is the acceleration sensor 4300 capable of detecting the acceleration. Therefore, a complex sensor device 4000 which is capable of being suitably used as, for example, a motion sensor and has very high convenience is obtained.

The arrangement of the acceleration sensor 4300 and the angular rate sensor 4400 is not particularly limited. For example, the acceleration sensor 4300 and the angular rate sensor 4400 may be mounted on the upper surface of the base substrate 4100 so as to interpose the semiconductor element 4200 between the acceleration sensor 4300 and the angular rate sensor 4400. With such a configuration, it is possible to reduce the height of the complex sensor device 4000.

Ninth Embodiment

Next, an inertial measurement unit according to a ninth embodiment will be described.

Figure 26:
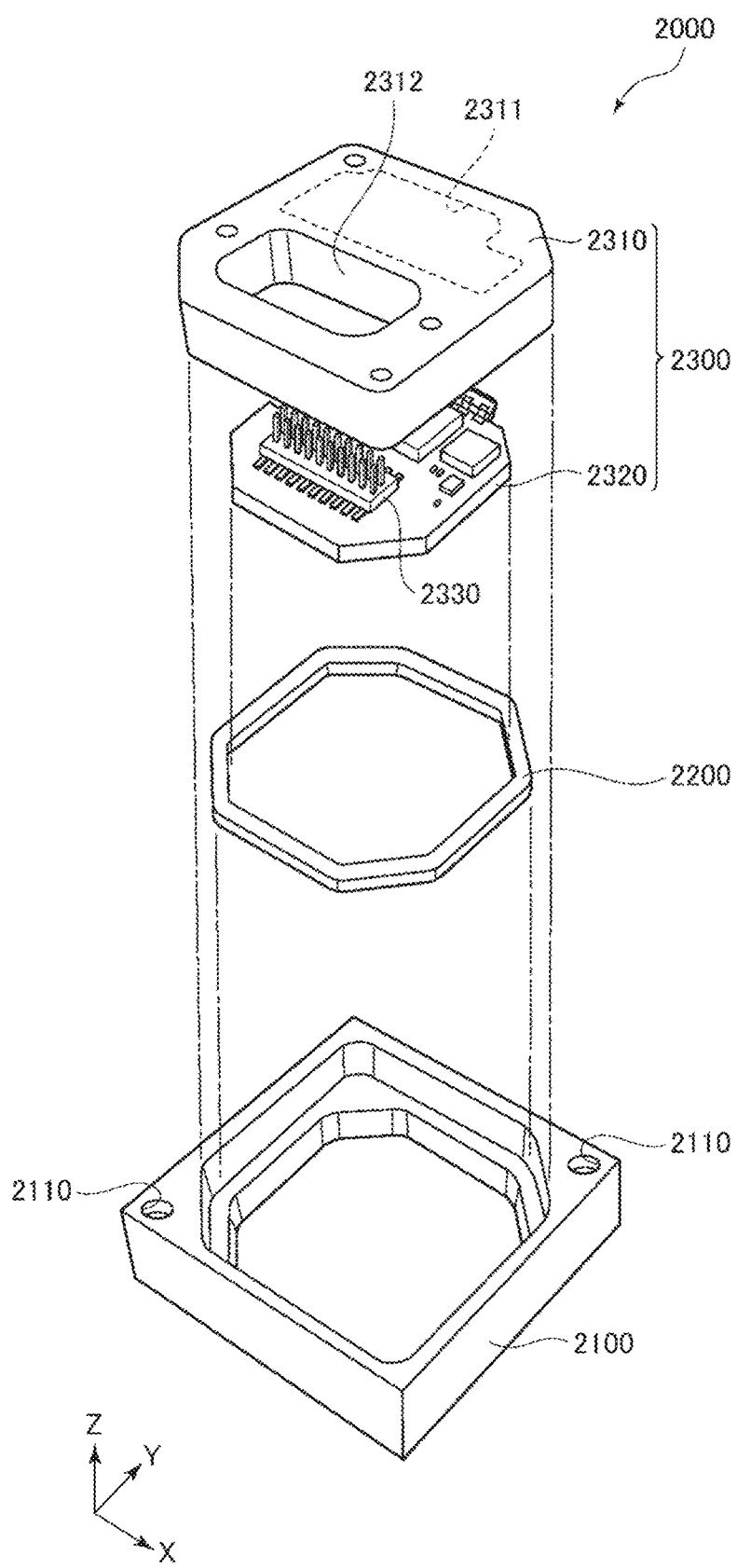
FIG. 26 is an exploded perspective view illustrating an inertial measurement unit according to a ninth embodiment.
Figure 27:
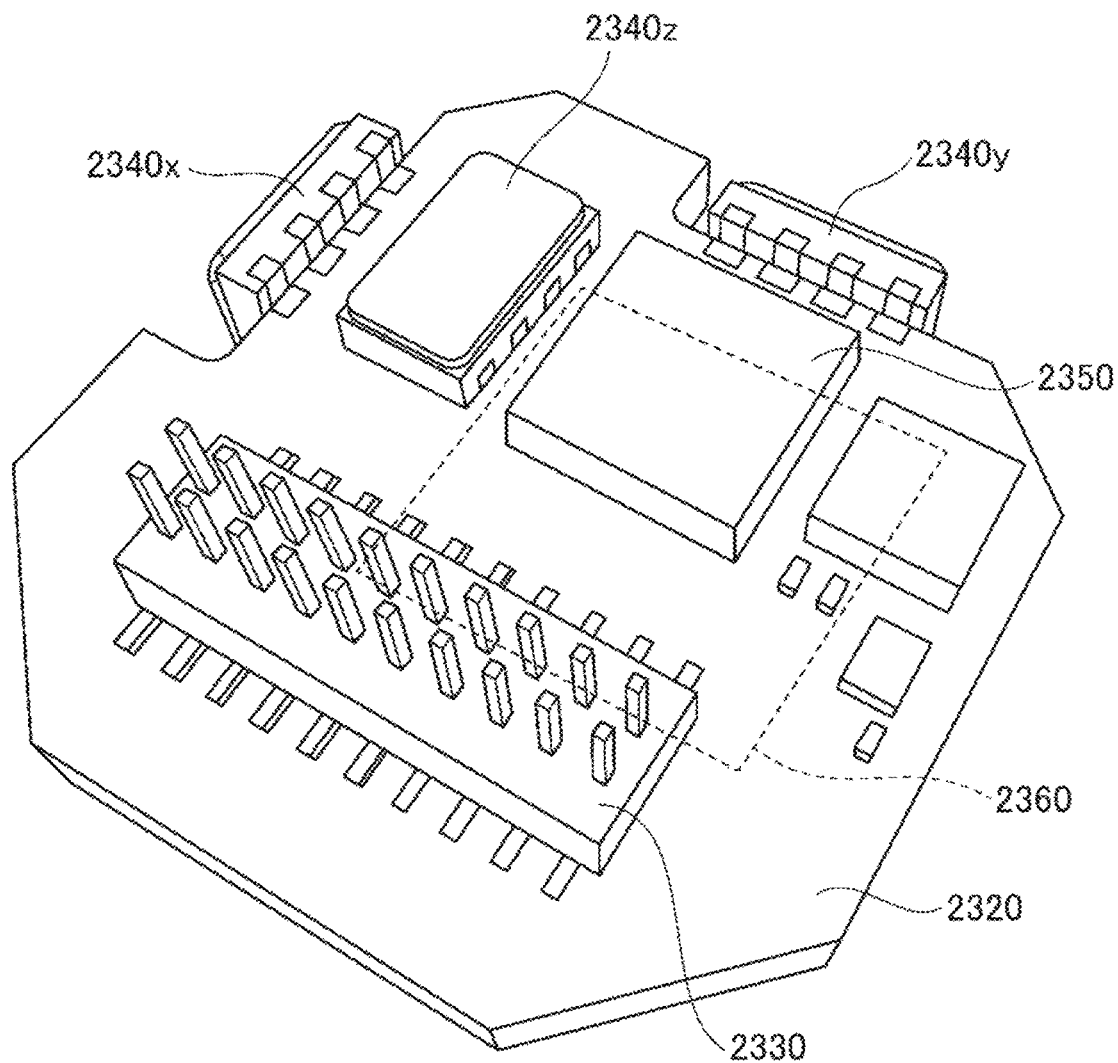
FIG. 27 is a perspective view illustrating a substrate provided in the inertial measurement unit illustrated in FIG. 26.

FIG. 26 is an exploded perspective view illustrating the inertial measurement unit according to the ninth embodiment. FIG. 27 is a perspective view illustrating a substrate provided in the inertial measurement unit illustrated in FIG. 26.

The inertial measurement unit (IMU) 2000 illustrated in FIG. 26 is an inertial measurement unit that detects an attitude or a movement (inertial momentum) of a vehicle (device in which the unit is mounted) such as an automobile or a robot. The inertial measurement unit 2000 functions as a so-called six-axis motion sensor which includes a three-axis acceleration sensor and a three-axis angular rate sensor.

The inertial measurement unit 2000 is a rectangular parallelepiped having a planar shape which is roughly square. Screw holes 2110 as the fixation portions are formed in the vicinity of two vertices positioned in a diagonal direction of the square. The inertial measurement unit 2000 can be fixed to a mounting target surface of a mounting target object such as an automobile by causing two screws to pass through the two screw holes 2110. The size thereof can be reduced to a size as small as can be mounted in, for example, a smartphone or a digital camera, by selecting components or changing a design.

The inertial measurement unit 2000 includes an outer case 2100, a bonding member 2200, and a sensor module 2300. The inertial measurement unit 2000 has a configuration in which the sensor module 2300 is inserted into the outer case 2100 with the bonding member 2200 interposed between the outer case 2100 and the sensor module 2300. The sensor module 2300 includes an inner case 2310 and a substrate 2320.

The appearance of the outer case 2100 is a rectangular parallelepiped having a planar shape which is roughly square, similar to the entire shape of the above-described inertial measurement unit 2000. The screws hole 2110 are formed in the vicinity of two vertices positioned in a diagonal direction of the square. The outer case 2100 has a box shape, and the sensor module 2300 is stored in the outer case 2100.

The inner case 2310 is a member that supports the substrate 2320 and has a shape that fits in the outer case 2100. A recess portion 2311 for preventing a contact with the substrate 2320 or an opening 2312 for exposing a connector 2330 (which will be described later) is formed in the inner case 2310. Such an inner case 2310 is bonded to the outer case 2100 with the bonding member 2200 (for example, packing in which an adhesive has been impregnated). The substrate 2320 is bonded to the lower surface of the inner case 2310 with an adhesive.

As illustrated in FIG. 27, the connector 2330, an angular rate sensor 2340z that detects an angular rate about the Z axis, an acceleration sensor 2350 that detects an acceleration in each axis direction of the X axis, the Y axis, and the Z axis, and the like are mounted on the upper surface of the substrate 2320. An angular rate sensor 2340x that detects an angular rate about the X axis and an angular rate sensor 2340y that detects an angular rate about the Y axis are mounted on the side surface of the substrate 2320. The physical quantity sensor 1 can be applied as the sensors 2340z, 2340x, 2340y, and 2350.

A control IC 2360 is mounted on the lower surface of the substrate 2320. The control IC 2360 is a micro-controller unit (MCU). The control IC includes a storage unit including anon-volatile memory, an A/D converter, and the like mounted therein, and controls the components of the inertial measurement unit 2000. The storage unit stores a program in which the procedure and the details for detecting an acceleration and an angular rate have been specified, a program of digitizing detection data and incorporating the data into packet data, accompanying data, and the like. In addition, a plurality of electronic components is mounted on the substrate 2320.

Hitherto, the inertial measurement unit 2000 is described. As described above, such an inertial measurement unit 2000 includes the angular rate sensors 2340z, 2340x, and 2340y, and the acceleration sensor 2350 as the physical quantity sensors and the control IC (control circuit) 2360 that controls driving of each of the sensors 2340z, 2340x, 2340y, and 2350. Thus, an inertial measurement unit 2000 which is capable of exhibiting the effect of the physical quantity sensor and has high reliability is obtained.

Tenth Embodiment

Next, a vehicle positioning device according to a tenth embodiment will be described.

Figure 28:
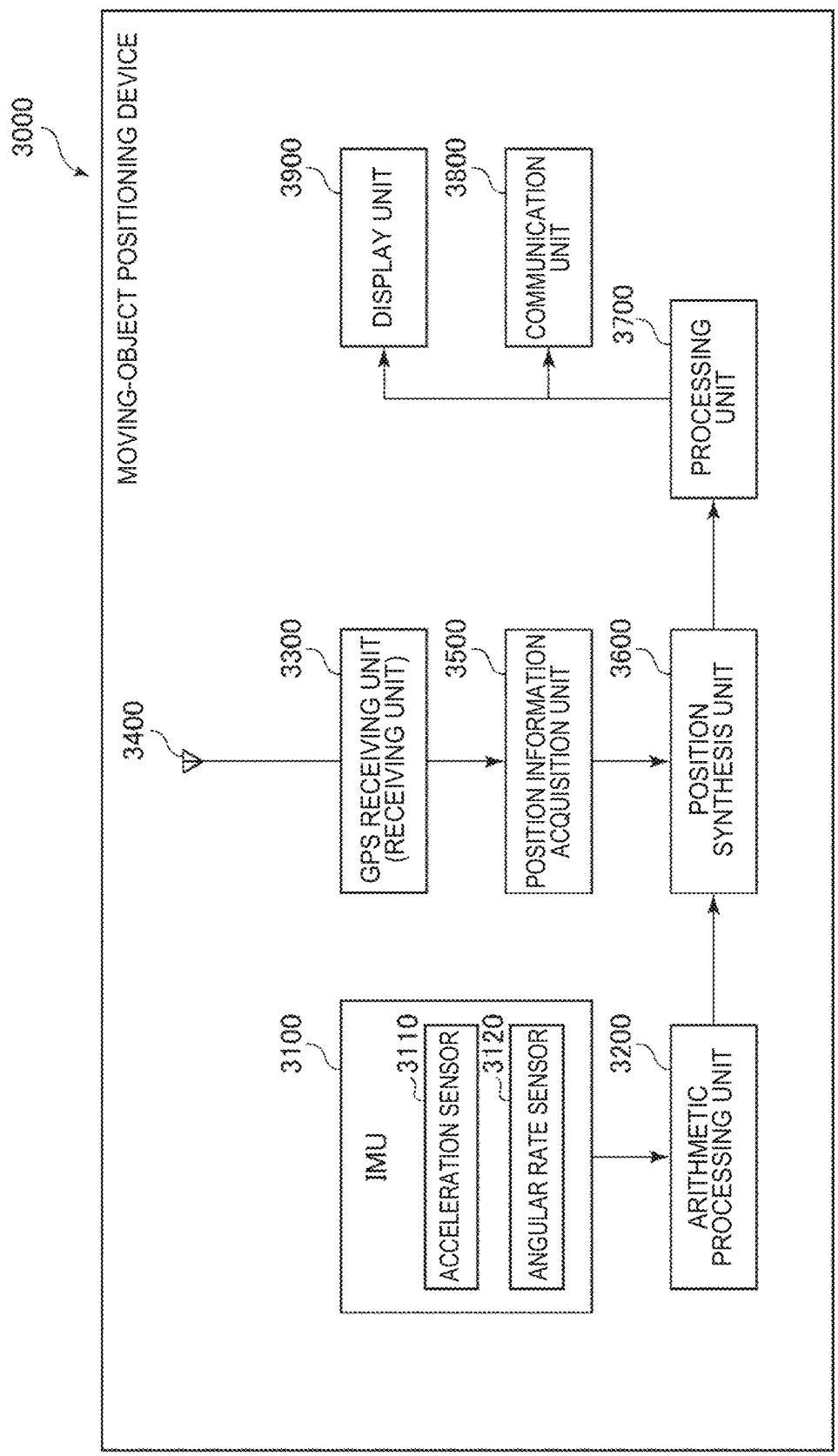
FIG. 28 is a block diagram illustrating an entire system of a vehicle positioning device according to a tenth embodiment.
Figure 29:
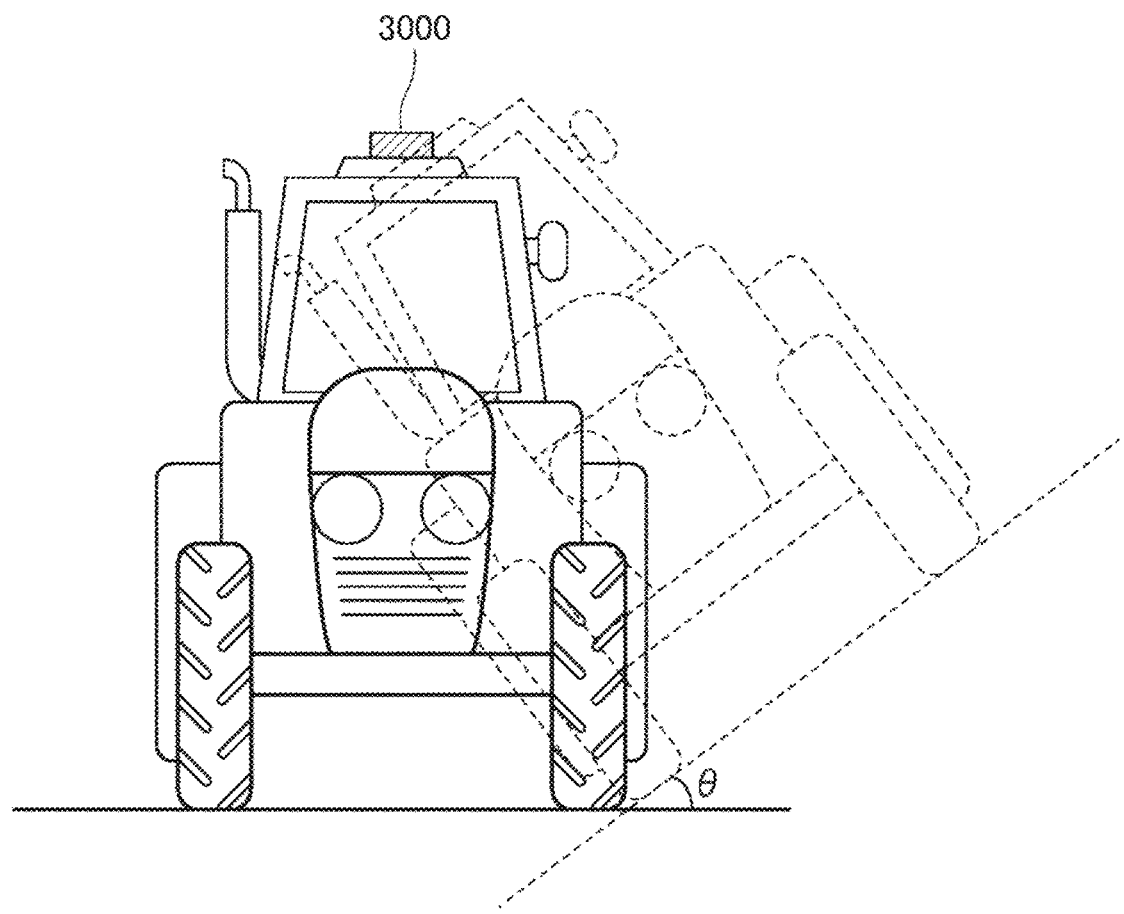
FIG. 29 is a diagram illustrating an action of the vehicle positioning device illustrated in FIG. 28.

FIG. 28 is a block diagram illustrating the entire system of the vehicle positioning device according to the tenth embodiment. FIG. 29 is a diagram illustrating an action of the vehicle positioning device illustrated in FIG. 28.

A vehicle positioning device 3000 illustrated in FIG. 28 is a device which is used in a state of being mounted in a vehicle and is used for positioning the vehicle. The vehicle is not particularly limited. Any of bicycles, automobiles (including four-wheeled vehicles and bikes), trains, airplanes, ships, and the like may be provided. In this embodiment, descriptions will be made on the assumption that the vehicle is a four-wheeled vehicle. The vehicle positioning device 3000 includes an inertial measurement unit (IMU) 3100, an arithmetic processing unit (processor) 3200, a GPS receiving unit (receiver) 3300, a receiving antenna 3400, a position information acquisition unit 3500, a position synthesis unit (synthesizer) 3600, a processing unit (processor) 3700, a communication unit 3800, and a display unit 3900. For example, the above-described inertial measurement unit 2000 can be used as the inertial measurement unit 3100.

The inertial measurement unit 3100 includes a three-axis acceleration sensor 3110 and a three-axis angular rate sensor 3120. The arithmetic processing unit (processor) 3200 receives acceleration data from the acceleration sensor 3110 and angular rate data from the angular rate sensor 3120. The arithmetic processing unit (processor) performs inertial navigation arithmetic processing on the received data, and thus outputs inertial navigation positioning data (data including an acceleration and an attitude of the vehicle).

The GPS receiving unit (receiver) 3300 receives a signal (GPS carrier wave, satellite signal on which position information is superimposed) from a GPS satellite through the receiving antenna 3400. The position information acquisition unit 3500 outputs GPS positioning data indicating the position (latitude, longitude, and altitude), the speed, and the azimuth of the vehicle positioning device (vehicle) 3000, based on the signal received from the GPS receiving unit (receiver) 3300. The GPS positioning data also includes status data indicating a reception state, a reception time point, or the like.

The position synthesis unit (synthesizer) 3600 calculates the position of the vehicle, specifically, the position of the vehicle travelling on a map, based on inertial navigation positioning data output from the arithmetic processing unit (processor) 3200 and GPS positioning data output from the position information acquisition unit 3500. For example, if the attitude of the vehicle is different by an influence of the inclination of a map, as illustrated in FIG. 29, even though the position of the vehicle, which is included in the GPS positioning data is the same, the vehicle seems to travel at a different position on the map. Therefore, calculating the precise position of the vehicle only with GPS positioning data is not possible. The position synthesis unit (synthesizer) 3600 calculates the position of the vehicle travelling on the map, by using the inertial navigation positioning data (in particular, data regarding the attitude of the vehicle). The determination can be performed relatively easily by calculation using a trigonometric function (inclination θ with respect to the vertical direction).

The processing unit (processor) 3700 performs predetermined processing on position data output from the position synthesis unit (synthesizer) 3600. The resultant is displayed, as a result of the positioning, in the display unit 3900. The position data may be transmitted to an external device by the communication unit 3800.

Hitherto, the vehicle positioning device 3000 is described. As described above, such a vehicle positioning device 3000 includes the inertial measurement unit 3100, the GPS receiving unit (receiving unit) (receiver) 3300 that receives a satellite signal on which position information has been superimposed, from a positioning satellite, the position information acquisition unit (acquisition unit) 3500 that acquires position information of the GPS receiving unit (receiver) 3300 based on the received satellite signal, the arithmetic processing unit (processor) (computation unit) 3200 that calculates the attitude of the vehicle based on inertial navigation positioning data (inertial data) output from the inertial measurement unit 3100, and the position synthesis unit (synthesizer) (calculation unit) 3600 that calculates the position of the vehicle by correcting the position information based on the calculated attitude. Thus, a vehicle positioning device 3000 which is capable of exhibiting the effect of the above-described inertial measurement unit 2000 and has high reliability is obtained.

Eleventh Embodiment

Next, an electronic device according to an eleventh embodiment will be described.

Figure 30:
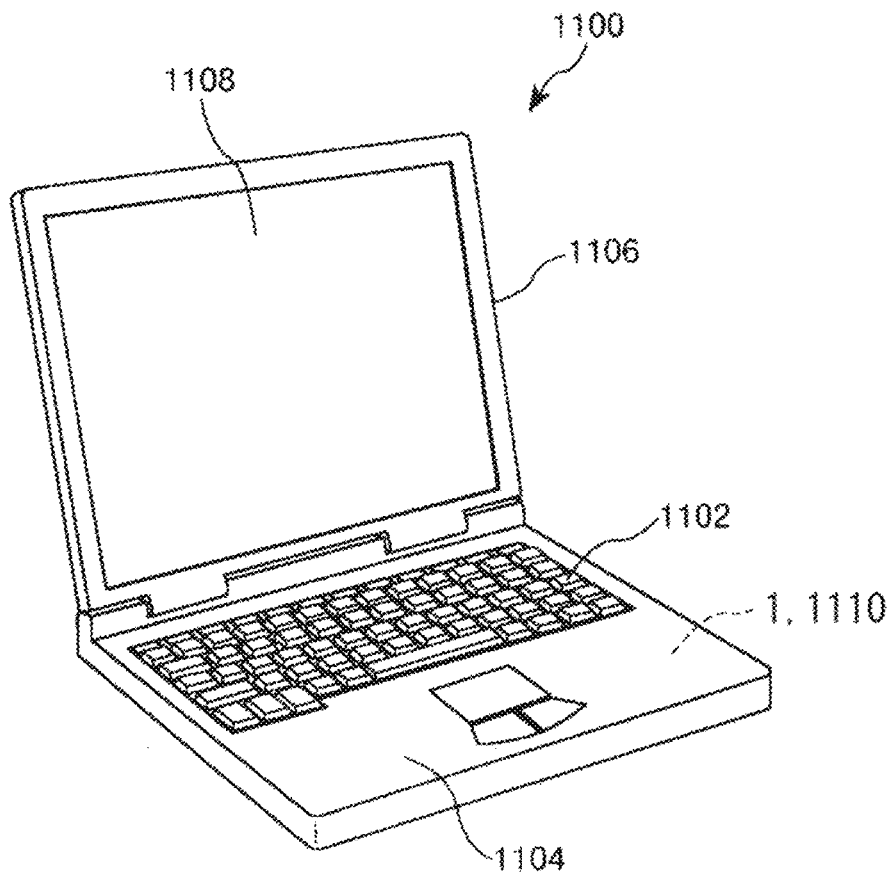
FIG. 30 is a perspective view illustrating an electronic device according to an eleventh embodiment.

FIG. 30 is a perspective view illustrating the electronic device according to the eleventh embodiment.

The electronic device in this embodiment is applied to a mobile type (or notebook type) personal computer 1100 illustrated in FIG. 30. The personal computer 1100 includes a main body 1104 including a keyboard 1102 and a display device 1106 including a display unit 1108. The display device 1106 is supported to be allowed to rotate around the main body 1104 by a hinge structure portion. A physical quantity sensor 1 and a control circuit (control unit (controller)) 1110 are mounted in the personal computer 1100. The control circuit 1110 performs control based on a detection signal output from the physical quantity sensor 1. For example, the physical quantity sensor in any of the above-described embodiments can be used as the physical quantity sensor 1.

Such a personal computer (electronic device) 1100 includes the physical quantity sensor 1 and the control circuit (control unit (controller)) 1110 that performs control based on a detection signal output from the physical quantity sensor 1. Therefore, it is possible to exhibit the effect of the above-described physical quantity sensor 1 and to exhibit high reliability.

Twelfth Embodiment

Next, an electronic device according to a twelfth embodiment of the invention will be described.

Figure 31:
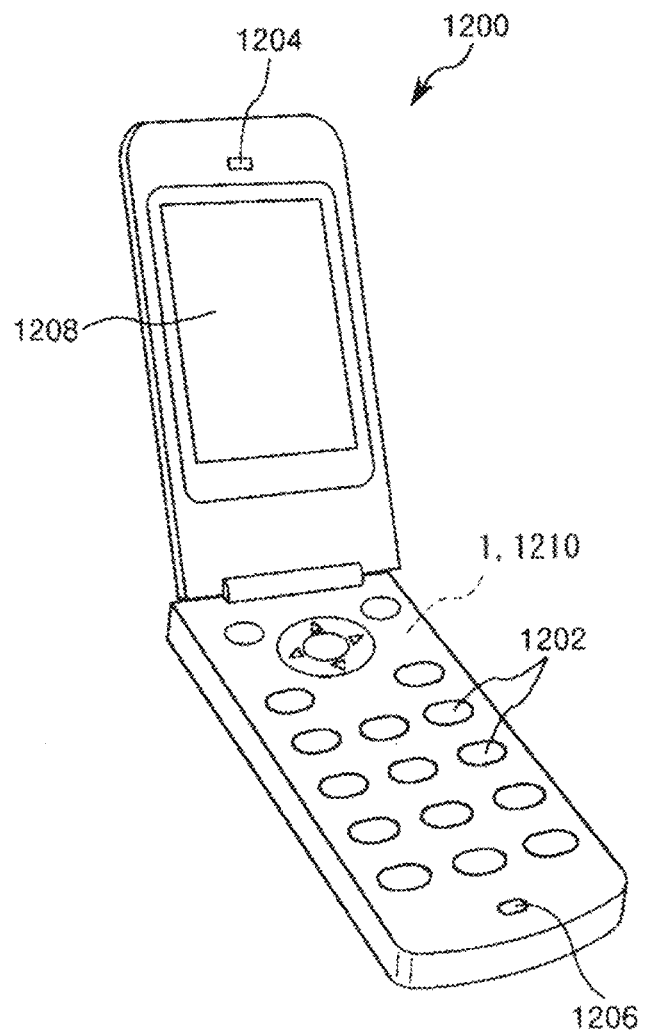
FIG. 31 is a perspective view illustrating an electronic device according to a twelfth embodiment.

FIG. 31 is a perspective view illustrating the electronic device according to the twelfth embodiment of the invention.

The electronic device in this embodiment is applied to a portable phone 1200 (including a PHS) illustrated in FIG. 31. The portable phone 1200 includes an antenna (not illustrated), a plurality of operation buttons 1202, an earpiece 1204, and a mouthpiece 1206. A display unit 1208 is disposed between the operation button 1202 and the earpiece 1204. A physical quantity sensor 1 and a control circuit (control unit (controller)) 1210 are mounted in the portable phone 1200. The control circuit 1210 performs control based on a detection signal output from the physical quantity sensor 1.

Such a portable phone (electronic device) 1200 includes the physical quantity sensor 1 and the control circuit (control unit (controller)) 1210 that performs control based on a detection signal output from the physical quantity sensor 1. Therefore, it is possible to exhibit the effect of the above-described physical quantity sensor 1 and to exhibit high reliability.

Thirteenth Embodiment

Next, an electronic device according to a thirteenth embodiment will be described.

Figure 32:
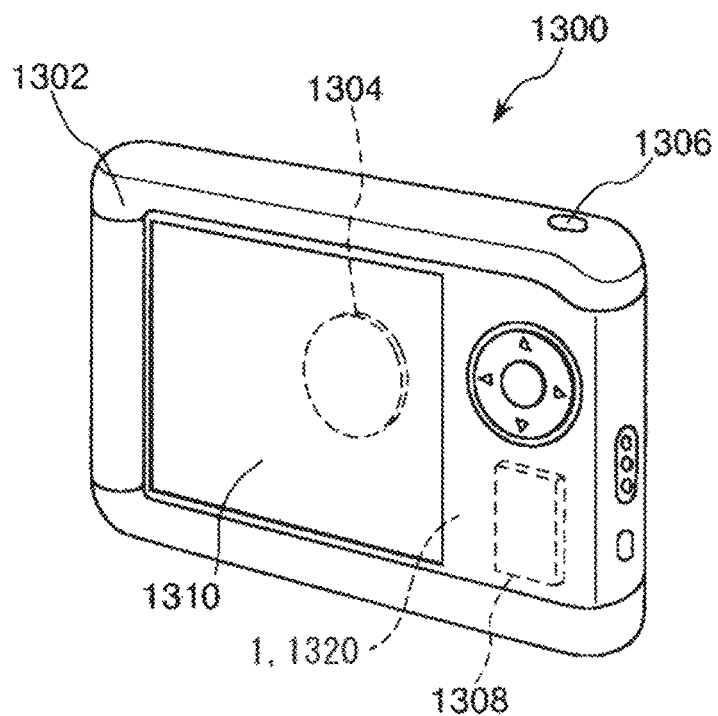
FIG. 32 is a perspective view illustrating an electronic device according to a thirteenth embodiment.

FIG. 32 is a perspective view illustrating the electronic device according to the thirteenth embodiment.

The electronic device in this embodiment is applied to a digital still camera 1300 illustrated in FIG. 32. The digital still camera 1300 includes a case 1302. A display unit 1310 is provided on the back surface of the case 1302. The display unit 1310 has a configuration in which display is performed based on an imaging signal obtained by a CCD. The display unit 1310 functions as a viewfinder that displays a subject in a form of an electronic image. A light receiving unit (receiver) 1304 that includes an optical lens (optical imaging system), the CCD, and the like is provided on the front surface side (rear surface side in FIG. 32) of the case 1302. If a photographer checks a subject displayed in the display unit 1310 and pushes the shutter button 1306, an imaging signal at this time is transferred from the CCD and stored in the memory 1308. A physical quantity sensor 1 and a control circuit (control unit (controller)) 1320 are mounted in the digital still camera 1300. The control circuit 1320 performs control based on a detection signal output from the physical quantity sensor 1. The physical quantity sensor 1 is used in image stabilization, for example.

Such a digital still camera (electronic device) 1300 includes the physical quantity sensor 1 and the control circuit (control unit (controller)) 1320 that performs control based on a detection signal output from the physical quantity sensor 1. Therefore, it is possible to exhibit the effect of the above-described physical quantity sensor 1 and to exhibit high reliability.

The electronic device can be applied to, for example, devices as follows in addition to the personal computer and the portable phone in the above-described embodiments and the digital still camera in this embodiment: a smartphone, a tablet terminal, a clock (including a smart watch), an ink jet ejecting apparatus (for example, ink jet printer), a laptop type personal computer, a television, a wearable terminal such as a head mount display (HMD), a video camera, a video tape recorder, a car navigation system, a pager, an electronic notebook (including a type having a communication function), electronic dictionary, an electronic calculator, an electronic game machine, a word processor, a worksta-tion, a video phone, a security television monitor, electronic binoculars, a POS terminal, medical equipment (for example, a clinical electronic thermometer, a blood pressure monitor, a blood glucose meter, an electrocardiogram measuring device, an ultrasonic diagnostic device, and an electronic endoscope), a fish finder, various measuring instruments, equipment for a vehicle terminal and a base station, instruments (for example, instruments of vehicles, aircrafts, ships), a flight simulator, a network server, and the like.

Fourteenth Embodiment

Next, a portable electronic device according to a fourteenth embodiment will be described.

Figure 33:
FIG. 33 is a plan view illustrating a portable electronic device according to a fourteenth embodiment.
Figure 34:
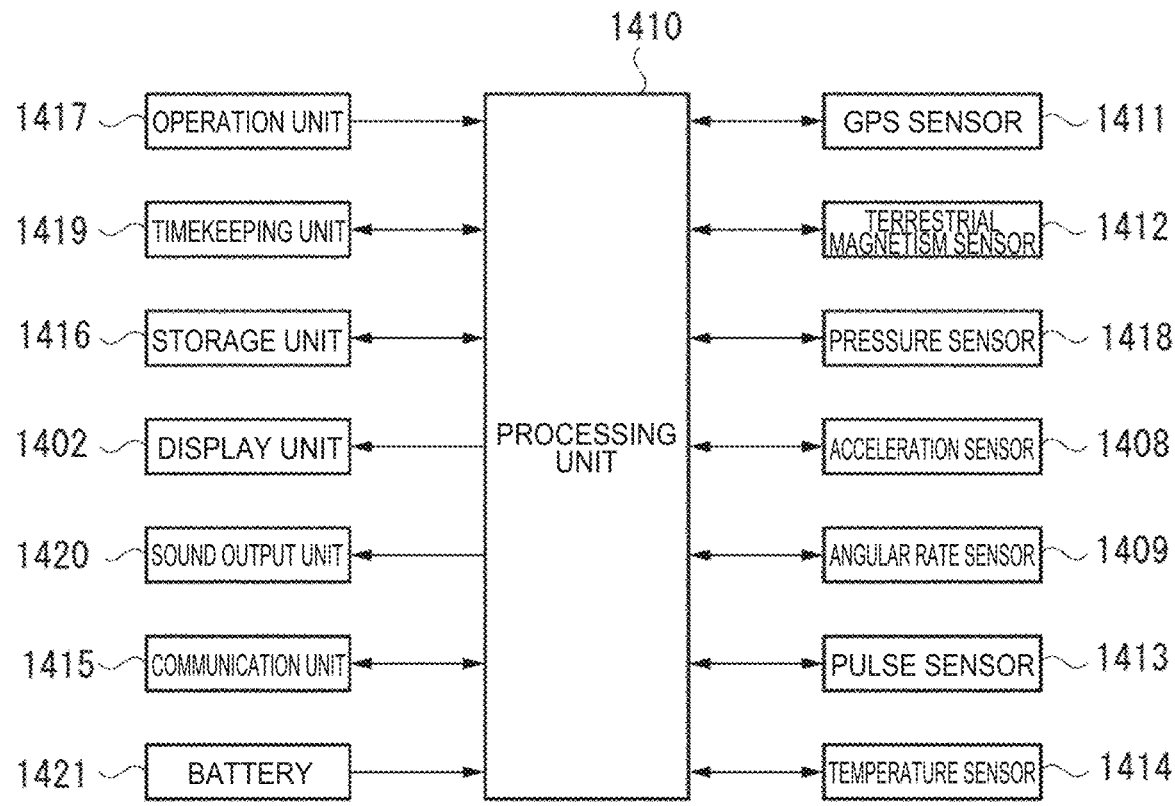
FIG. 34 is a functional block diagram schematically illustrating a configuration of the portable electronic device illustrated in FIG. 33.

FIG. 33 is a plan view illustrating the portable electronic device according to the fourteenth embodiment. FIG. 34 is a functional block diagram schematically illustrating a configuration of the portable electronic device illustrated in FIG. 33.

A wristwatch type activity meter (active tracker) 1400 illustrated in FIG. 33 is a wrist device to which the portable electronic device in this embodiment has been applied. The activity meter 1400 is mounted on a part (such as a wrist) (detection target) of a user by a band 1401. The activity meter 1400 includes a display unit 1402 in a manner of digital display and is capable of wireless communication. The above-described physical quantity sensor 1 according to the invention is incorporated into the activity meter 1400, as an acceleration sensor 1408 that measures an acceleration and an angular rate sensor 1409 that measures an angular rate.

The activity meter 1400 includes a case 1403, a processing unit (processor) 1410, a display unit 1402, and a translucent cover 1404. In the case 1403, the acceleration sensor 1408 and the angular rate sensor 1409 are accommodated. The processing unit (processor) 1410 is accommodated in the case 1403 and processes output data from the acceleration sensor 1408 and the angular rate sensor 1409. The display unit 1402 is accommodated in the case 1403. The translucent cover 1404 closes an opening portion of the case 1403. A bezel 1405 is provided on the outside of the translucent cover 1404. A plurality of operation buttons 1406 and 1407 is provided on the side surface of the case 1403.

As illustrated in FIG. 34, the acceleration sensor 1408 detects an acceleration in each of three axis directions which intersect each other (ideally, orthogonal to each other), and outputs a signal (acceleration signal) depending on the magnitudes and the directions of the detected accelerations in the three axes. An angular rate sensor 1409 detects an angular rate in each of three axis directions which intersect each other (ideally, orthogonal to each other), and outputs a signal (angular rate signal) depending on the magnitudes and the directions of the detected angular rates in the three axes.

In a liquid crystal display (LCD) constituting the display unit 1402, various types of information as follows are displayed in accordance with various detection modes; for example, position information or the movement quantity obtained by using a GPS sensor 1411 or a terrestrial magnetism sensor 1412; motion information such as the momentum, which has been obtained by using the acceleration sensor 1408, the angular rate sensor 1409, or the like; biometric information regarding a pulse rate obtained by using a pulse sensor 1413 or the like; and time information on the current time. An environmental temperature obtained by a temperature sensor 1414 can also be displayed.

A communication unit 1415 performs various controls for establishing a communication between a user terminal and an information terminal (not illustrated). The communication unit 1415 includes, for example, a transmitter-receiver compatible with short-range wireless communication standards such as Bluetooth (registered trademark) (including Bluetooth Low Energy (BTLE)), Wi-Fi (Wireless Fidelity) (registered trademark), Zigbee (registered trademark), NFC (Near field communication), and ANT+ (registered trademark) and a connector compatible with a communication bus standard such as a universal serial bus (USB).

The processing unit (processor) 1410 is configured with, for example, a micro-processing unit (MPU), a digital signal processor (DSP), and an application specific integrated circuit (ASIC). The processing unit (processor) 1410 performs various kinds of processing based on a program stored in a storage unit 1416 and a signal input from an operation unit 1417 (For example, operation buttons 1406 and 1407). The processing performed by the processing unit (processor) 1410 includes data processing on output signals from the GPS sensor 1411, the terrestrial magnetism sensor 1412, the pressure sensor 1418, the acceleration sensor 1408, the angular rate sensor 1409, the pulse sensor 1413, the temperature sensor 1414, and a timekeeping unit 1419, display processing of displaying an image in the display unit 1402, sound output processing of outputting sound to a sound output unit 1420, communication processing of performing a communication with an information terminal via the communication unit 1415, power control processing of supplying power from a battery 1421 to the units, and the like.

Such an activity meter 1400 can have at least functions as follows.

1. Distance: measure the total distance from a point in which measuring starts, by a GPS function having high precision
2. Pace: display the current travel pace through pace distance measurement
3. Average speed: calculate an average speed from a point in which traveling at the average speed start to the current point, and display the calculated average speed
4. Altitude: measure and display the altitude by the GPS function
5. Stride: measure and display the stride even in a tunnel where GPS radio waves do not reach
6. Pitch: measure and display the number of steps per one minute
7. Heart rate: measure and display the heart rate by the pulse sensor
8. Gradient: measure and display the gradient of the ground in training and trail runs in the mountains
9. Auto lap: automatically measure lap time when travelling for a predetermined distance or for a predetermined time
10. Exercise consumed calorie: display calories consumed
11. Number of steps: display the total number of steps from when starting an exercise Such an activity meter (portable electronic device) 1400 includes the physical quantity sensor 1, the case 1403 in which the physical quantity sensor 1 is accommodated, the processing unit (processor) 1410 which is accommodated in the case 1403 and processes output data from the physical quantity sensor 1, the display unit 1402 accommodated in the case 1403, and the translucent cover 1404 that closes the opening portion of the case 1403. Therefore, it is possible to exhibit the effect of the above-described physical quantity sensor 1 and to exhibit high reliability.

As described above, the activity meter 1400 includes the GPS sensor (satellite positioning system) 1411, and thus can measure a movement distance or a movement trajectory of a user. Therefore, an activity meter 1400 having high convenience is obtained.

The activity meter 1400 can be widely applied to a running watch, a runner's watch, a runner's watch for multisports such as duathlon and triathlon, an outdoor watch, and a GPS watch equipped with a satellite positioning system, for example, a GPS.

The above descriptions are made by using a global positioning system (GPS) as the satellite positioning system. However, other global navigation satellite systems (GNSS) may be used. For example, one, or two or more of satellite positioning systems such as the European geostationary-satellite navigation overlay service (EGNOS), the quasi-zenith satellite system (QZSS), the global navigation satellite system (GLONASS), GALILEO, and the BeiDou navigation satellite system (BeiDou) may be used. A geostationary-satellite type satellite-based augmentation system (SBAS) such as the wide area augmentation system (WAAS) and the European geostationary-satellite navigation overlay service (EGNOS) may be used as at least one satellite positioning system.

Fifteenth Embodiment

Next, a vehicle according to a fifteenth embodiment will be described.

Figure 35:
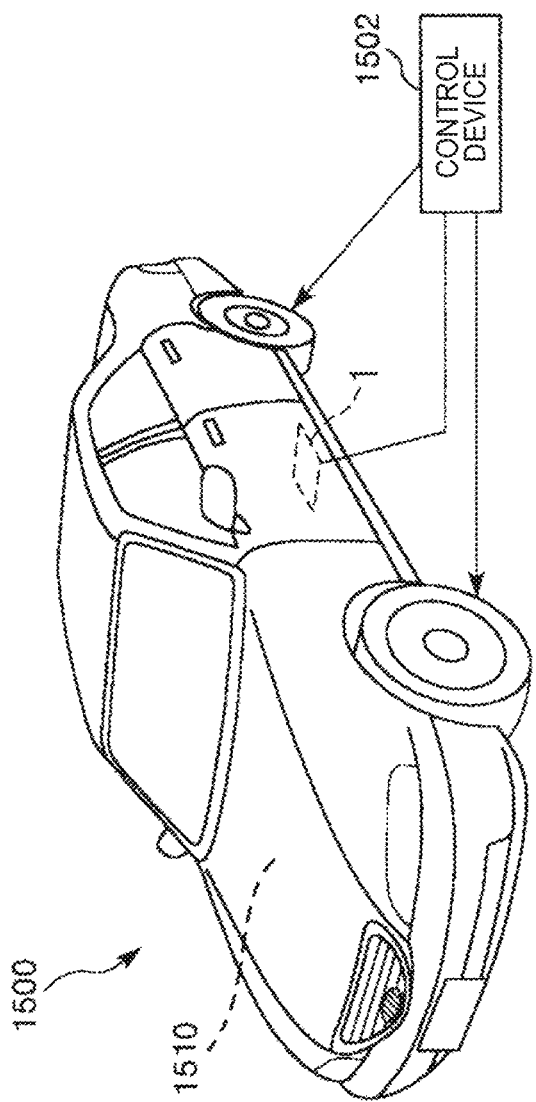
FIG. 35 is a perspective view illustrating a vehicle according to a fifteenth embodiment.

FIG. 35 is a perspective view illustrating the vehicle according to the fifteenth embodiment.

An automobile 1500 illustrated in FIG. 35 is an automobile to which the vehicle in this embodiment has been applied. In FIG. 35, the automobile 1500 includes a system 1510 which is at least one of an engine system, a brake system, and a keyless entry system. A physical quantity sensor 1 is mounted in the automobile 1500. A detection signal of the physical quantity sensor 1 is supplied to a control device 1502, and the control device 1502 can control the system 1510 based on the detection signal.

Such an automobile (vehicle) 1500 includes the physical quantity sensor 1 and the control device (control unit (controller)) 1502 that performs control based on a detection signal output from the physical quantity sensor 1. Therefore, it is possible to exhibit the effect of the above-described physical quantity sensor 1 and to exhibit high reliability. The automobile 1500 includes the system 1510 which is at least one of the engine system, the brake system, and the keyless entry system. The control device 1502 controls the system 1510 based on the detection signal. Thus, it is possible to control the system 1510 with high precision.

In addition, the physical quantity sensor 1 can be widely applied to an electronic control unit (ECU) in a car navigation system, a car air conditioner, an antilocking brake system (ABS), an air bag, a tire pressure monitoring system (TPMS), an engine controller, a battery monitor of a hybrid automobile or an electric automobile, and the like.

The vehicle is not limited to the automobile 1500. For example, the vehicle can also be applied to airplanes, rockets, artificial satellites, ships, automated guided vehicles (AGV), bipedal walking robots, and unmanned aircrafts such as drones.

Hitherto, the physical quantity sensor, the physical quantity sensor device, the complex sensor device, the inertial measurement unit, the vehicle positioning device, the portable electronic device, the electronic device, and the vehicle are described based on the embodiments in the drawings.

However, the invention is not limited thereto. The components can be substituted with any components having the same functions. Any other constituent may be added to the invention. The above-described embodiments may be appropriately combined.

In the above-described embodiments, the configuration in which the physical quantity sensor detects the angular rate about the Y axis is described. However, the invention is not limited thereto. The physical quantity sensor may detect an angular rate about the X axis or may detect an angular rate about the Z axis. In the above-described embodiments, the configuration in which the physical quantity sensor detects the angular rate is described. However, the physical quantity detected by the physical quantity sensor is not particularly limited. For example, an acceleration or pressure may be detected. The physical quantity sensor may be capable of detecting a plurality of physical quantities. The plurality of physical quantities may be physical quantities having the same type and different detection axes (for example, an acceleration in the X-axis direction, an acceleration in the Y-axis direction, and an acceleration in the Z-axis direction, or an angular rate about the X axis, an angular rate about the Y axis, and an angular rate about the Z axis), or may be physical quantities different from each other (for example, an angular rate about the X axis and an acceleration in the X-axis direction).

What is claimed is:

1. A physical quantity sensor comprising:
a movable body; and
a spring that supports the movable body,
wherein the spring includes an arm having an elongate shape in a first direction, a first beam, and a second beam, the first beam and the second beam being adjacent to the arm and disposed in the first direction, and
an end portion of a free end of the first beam on the second beam side and an end portion of a free end of the second beam on the first beam side are disposed side by side in a second direction orthogonal to the first direction.

2. The physical quantity sensor according to claim 1,
wherein the first beam and the second beam are disposed on both sides of the arm in the second direction, respectively.

3. The physical quantity sensor according to claim 2,
wherein the first beam includes
a first portion having an elongate shape in the first direction,
a second portion which has an elongate shape in the first direction and is disposed to be shifted from the first portion in the second direction, and
a third portion that connects the first portion and the second portion.

4. The physical quantity sensor according to claim 2,
wherein the end portion of the first beam on the second beam side has a length in the second direction, which gradually decreases toward the second beam, and
the end portion of the second beam on the first beam side has a length in the second direction, which gradually decreases toward the first beam.

5. The physical quantity sensor according to claim 4,
wherein, in the end portion of the first beam on the second beam side, a surface on a side facing the second beam is inclined from the first direction in plan view from a third direction orthogonal to the first direction and the second direction, and
in the end portion of the second beam on the first beam side, a surface on a side facing the first beam is inclined from the first direction in plan view from the third direction.

6. The physical quantity sensor according to claim 2,
wherein the first beam includes a first base portion and a first protruding portion which protrudes from the first base portion toward the second beam and has a length in the second direction, which is smaller than that of the first base portion,
the second beam includes a second base portion and a second protruding portion which protrudes from the second base portion toward the first beam and has a length in the second direction, which is smaller than that of the second base portion, and
the first protruding portion and the second protruding portion are disposed side by side in the second direction.

7. The physical quantity sensor according to claim 6,
wherein the first protruding portion is disposed to be biased toward a side of the first base portion, which is opposite to the second protruding portion, and
the second protruding portion is disposed to be biased toward a side of the second base portion, which is opposite to the first protruding portion.

8. The physical quantity sensor according to claim 2, further comprising:
a third beam positioned on an opposite side of the first beam with respect to the second beam,
wherein an end portion of the second beam on the third beam side and an end portion of the third beam on the second beam side are disposed side by side in the second direction.

9. The physical quantity sensor according to claim 1,
wherein the first beam includes
a first portion having an elongate shape in the first direction,
a second portion which has an elongate shape in the first direction and is disposed to be shifted from the first portion in the second direction, and
a third portion that connects the first portion and the second portion.

10. The physical quantity sensor according to claim 1,
wherein the end portion of the first beam on the second beam side has a length in the second direction, which gradually decreases toward the second beam, and
the end portion of the second beam on the first beam side has a length in the second direction, which gradually decreases toward the first beam.

11. The physical quantity sensor according to claim 10,
wherein, in the end portion of the first beam on the second beam side, a surface on a side facing the second beam is inclined from the first direction in plan view from a third direction orthogonal to the first direction and the second direction, and
in the end portion of the second beam on the first beam side, a surface on a side facing the first beam is inclined from the first direction in plan view from the third direction.

12. The physical quantity sensor according to claim 1,
wherein the first beam includes a first base portion and a first protruding portion which protrudes from the first base portion toward the second beam and has a length in the second direction, which is smaller than that of the first base portion,
the second beam includes a second base portion and a second protruding portion which protrudes from the second base portion toward the first beam and has a length in the second direction, which is smaller than that of the second base portion, and the first protruding portion and the second protruding portion are disposed side by side in the second direction.

13. The physical quantity sensor according to claim 12, wherein the first protruding portion is disposed to be biased toward a side of the first base portion, which is opposite to the second protruding portion, and the second protruding portion is disposed to be biased toward a side of the second base portion, which is opposite to the first protruding portion.

14. The physical quantity sensor according to claim 1, further comprising:

a third beam positioned on an opposite side of the first beam with respect to the second beam, wherein an end portion of the second beam on the third beam side and an end portion of the third beam on the second beam side are disposed side by side in the second direction.

15. A physical quantity sensor device comprising:

the physical quantity sensor according to claim 1; and a circuit element.

16. An electronic device comprising:

the physical quantity sensor according to claim 1; and a controller that performs a control based on a detection signal output from the physical quantity sensor.

17. A vehicle comprising:

the physical quantity sensor according to claim 1; and a controller that performs a control based on a detection signal output from the physical quantity sensor.

* * * * *